(12) United States Patent
Lee et al.

(10) Patent No.: US 12,095,531 B2
(45) Date of Patent: Sep. 17, 2024

(54) ELECTRONIC DEVICE COMPRISING ANTENNA

(71) Applicant: Samsung Electronics Co., Ltd., Gyeonggi-do (KR)

(72) Inventors: Jongwon Lee, Gyeonggi-do (KR); Daehee Park, Gyeonggi-do (KR); Chonghwa Seo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 6 days.

(21) Appl. No.: 18/125,867

(22) Filed: Mar. 24, 2023

(65) Prior Publication Data

US 2023/0239018 A1 Jul. 27, 2023

Related U.S. Application Data

(63) Continuation of application No. PCT/KR2022/010961, filed on Jul. 26, 2022.

(30) Foreign Application Priority Data

Aug. 12, 2021 (KR) ........................ 10-2021-0106836

(51) Int. Cl.
H04B 7/06 (2006.01)
(52) U.S. Cl.
CPC ........... H04B 7/0608 (2013.01); H04B 7/066 (2013.01)
(58) Field of Classification Search
CPC .............................. H04B 7/0608; H04B 7/066
USPC ....................................................... 375/262
See application file for complete search history.

(56) References Cited

U.S. PATENT DOCUMENTS

| | | | |
|---|---|---|---|
| 9,608,711 B2 | 3/2017 | Bellamkonda et al. | |
| 10,432,292 B2 | 10/2019 | Tang et al. | |
| 10,790,895 B2 | 9/2020 | Kasher et al. | |
| 10,804,985 B2 | 10/2020 | Ge et al. | |
| 2007/0142004 A1* | 6/2007 | Yokoi | H04B 7/0845 455/121 |
| 2011/0250926 A1 | 10/2011 | Wietfeldt et al. | |
| 2013/0109449 A1 | 5/2013 | Desclos et al. | |

(Continued)

FOREIGN PATENT DOCUMENTS

JP 2011-239211 A 11/2011
KR 10-2007-0064235 A 6/2007

(Continued)

*Primary Examiner* — Leila Malek
(74) *Attorney, Agent, or Firm* — Cha & Reiter, LLC

(57) ABSTRACT

An electronic device according to various embodiments may include a plurality of antennas including a first antenna group and a second antenna group and a wireless communication circuit, and the wireless communication circuit may control the first antenna group to receive a first signal by establishing a first wireless communication channel of the first frequency band with an external device, measure a first channel capacity, select at least one antenna from the second antenna group based on correlation, identify a second channel capacity of a second wireless communication channel of the first frequency band which is able to be established using some of the first antenna group and the selected at least one antenna of the second antenna group, and control to receive the signal of the first frequency band by using some of the first antenna group and the selected at least one antenna.

20 Claims, 15 Drawing Sheets

(56) References Cited

U.S. PATENT DOCUMENTS

| | | |
|---|---|---|
| 2015/0155624 A1 | 6/2015 | Desclos |
| 2016/0036508 A1 | 2/2016 | Szini et al. |
| 2019/0103926 A1 | 4/2019 | Chen |
| 2020/0204232 A1* | 6/2020 | Jang .................... H04B 7/0486 |
| 2021/0083400 A1 | 3/2021 | Hong |
| 2021/0242588 A1 | 8/2021 | Lim et al. |
| 2021/0313682 A1 | 10/2021 | Park |

FOREIGN PATENT DOCUMENTS

| | | |
|---|---|---|
| KR | 10-1321372 B1 | 10/2013 |
| KR | 10-2018-0114181 A | 10/2018 |
| KR | 10-2019-0105732 A | 9/2019 |
| KR | 10-2020-0020197 A | 2/2020 |
| KR | 10-2020-0022266 A | 3/2020 |
| KR | 10-2020-0076368 A | 6/2020 |

\* cited by examiner

ELECTRONIC DEVICE COMPRISING ANTENNA

CROSS-REFERENCE TO RELATED APPLICATION(S)

This application is a continuation of International Application No. PCT/KR2022/010961 filed under the Patent Cooperation Treaty on Jul. 26, 2022, which claims priority to Korean Patent Application No. 10-2021-0106836 filed Aug. 12, 2021 in the Korean Intellectual Property Office.

BACKGROUND

1. Technical Field

Certain embodiments of the present disclosure relate to an electronic device including an antenna.

2. Description of Related Art

An electronic device may provide a communication service by establishing a radio communication channel with an external electronic device. For example, the electronic device may transmit and receive various information such as text, image, video, or voice by transmitting and receiving radio frequency (RF) signals of various frequency bands by use of various wireless communication schemes (e.g., long term evolution (LTE), wireless fidelity (Wi-Fi), near field communication (NFC), or Bluetooth).

As the amount of data transmitted and received rapidly increases, the electronic device may use multiple input multiple output (MIMO) to raise the capacity of the wireless communication channel.

An electronic device may need to consider not only a gain of an individual antenna, but also correlation between a plurality of antennas to maximize a capacity of a wireless communication channel. For example, with a signal to noise ratio (SNR) over a designated value, the wireless communication channel capacity may vary according to correlation between the plurality of the antennas rather than the antenna gain of each of the plurality of the antennas. The wireless communication channel capacity may decrease if there is a high correlation between the plurality of the antennas.

Certain embodiments of the present disclosure may select antennas having an optimal channel capacity based on the correlation between the plurality of the antennas, and receive a radio frequency (RF) signal of a designated frequency band via the selected antennas.

SUMMARY

According to an embodiment, an electronic device is provided. The electronic device comprises a first antenna group comprising two or more antennas, and receiving a signal of a first frequency band, a second antenna group including one or more antennas, and receiving a signal of the first frequency band or a second frequency band and a wireless communication circuit electrically connected to the first antenna group and the second antenna group. The wireless communication circuit is configured to receive a first signal on a first wireless communication channel of the first frequency band with an external device using the first antenna group, measure a first channel capacity of the first wireless communication channel using the first antenna group, select at least one antenna from the second antenna group based on correlation between receiving a second signal of the first frequency band at the second antenna group and receiving the first signal at the first antenna group, estimate a second channel capacity of a second wireless communication channel of the first frequency band which is able to be established using some of the first antenna group and the selected at least one antenna of the second antenna group, and receive signals of the first frequency band by using some of the first antenna group and the selected at least one antenna, in case that the second channel capacity is greater than the first channel capacity.

According to an embodiment, a method of operating an electronic device is provided. The electronic device comprises a first antenna group and a second antenna group. The method comprises controlling the first antenna group to receive a first signal on a first wireless communication channel of a first frequency band with an external device, measuring a first channel capacity of the wireless communication channel using the first antenna group, selecting at least one antenna from the second antenna group based on correlation between receiving a second signal of the first frequency band at the second antenna group and receiving the first signal at the first antenna group, estimating a second channel capacity of a second wireless communication channel of the first frequency band which is able to be established using some of the first antenna group and the selected at least one antenna of the second antenna group; and receiving signals of the first frequency band by using some of the first antenna group and the selected at least one antenna, in case that the second channel capacity is greater than the first channel capacity.

BRIEF DESCRIPTION OF THE DRAWINGS

With respect to description of the drawings, the same or similar reference numerals may be used for the same or similar components.

DETAILED DESCRIPTION

According to certain embodiments of the present disclosure, an electronic device may obtain improved channel capacity and data throughput by receiving a radio frequency (RF) signal via antennas selected based on correlation between a plurality of antennas.

Besides, various effects directly or indirectly obtained from this document may be provided.

Hereinafter, certain embodiments of the present invention are described with reference to the accompanying drawings. However, this is not intended to limit the present invention to a specific embodiment, and it should be understood that various modifications, equivalents, and/or alternatives of the embodiments of the present invention are included.

Figure 1:
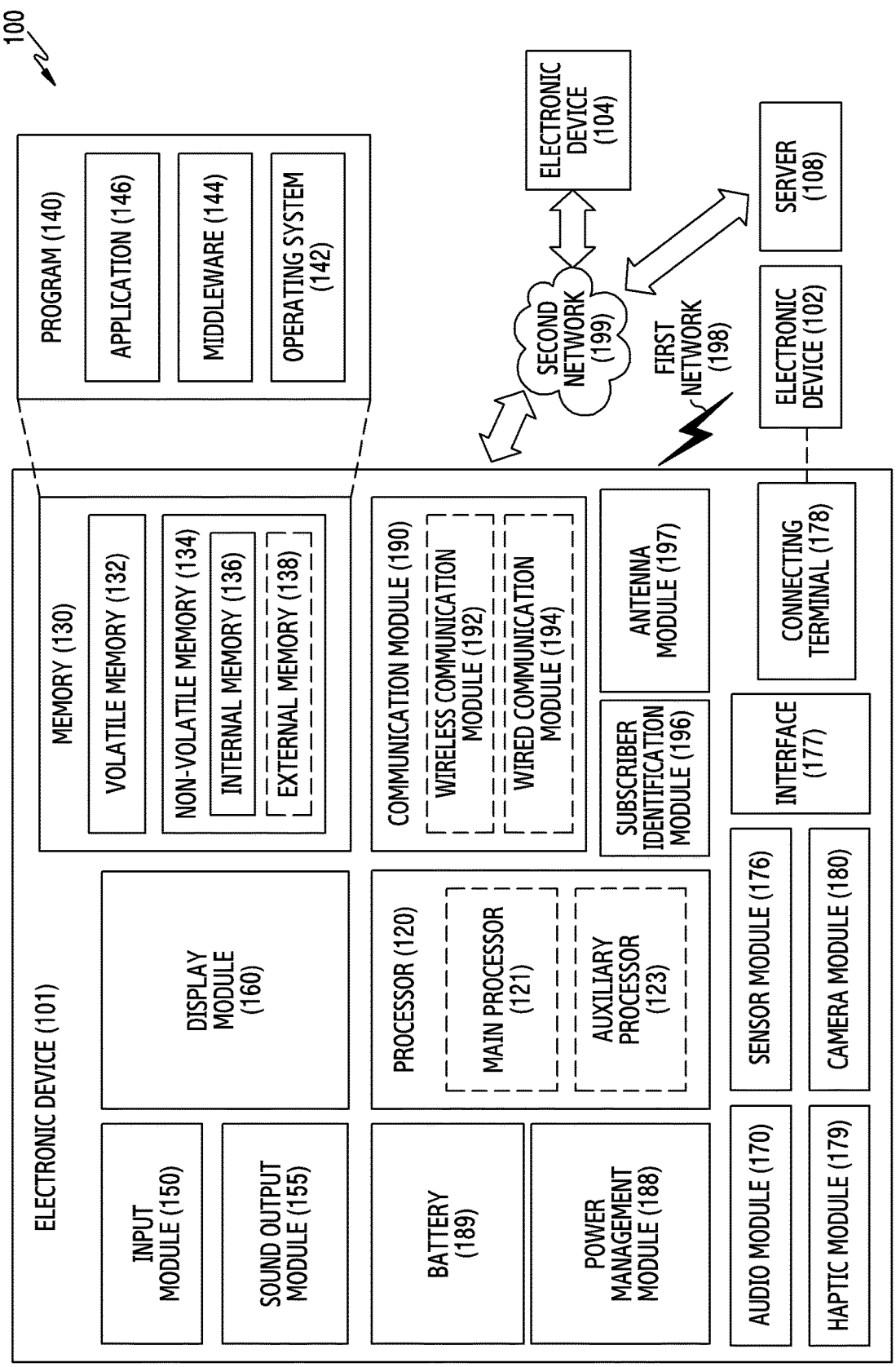
FIG. 1 is a diagram illustrating an electronic device in a network environment according to an embodiment.
Figure 2A:
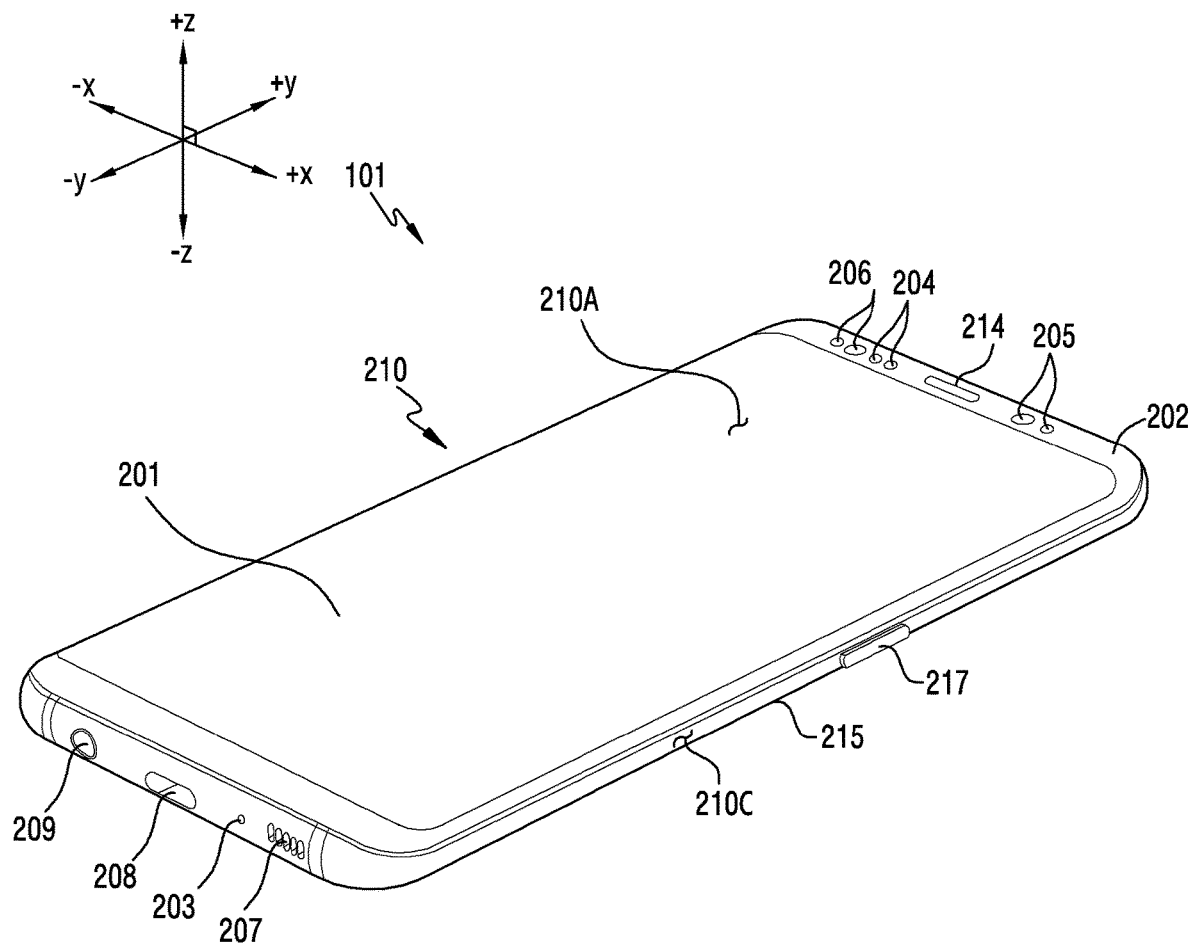
FIG. 2A is a perspective view illustrating an electronic device according to an embodiment.
Figure 2B:
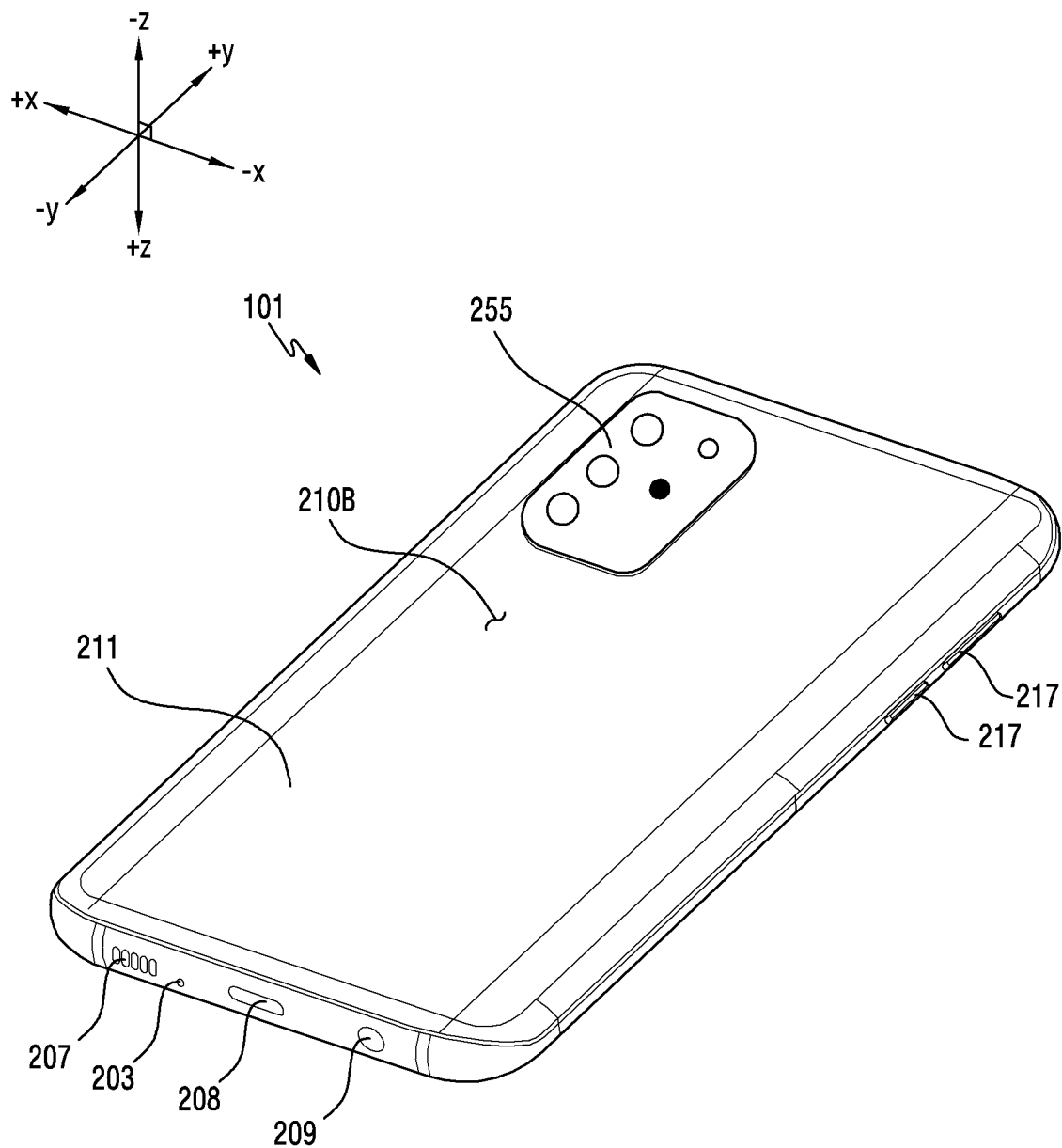
FIG. 2B is a perspective view taken from back of the electronic device of FIG. 2A.

FIGS. 1, 2A, and 2B describes an electronic device 101. For example, the electronic device 101 may transmit and receive various information such as text, image, video, or voice by transmitting and receiving radio frequency (RF) signals of various frequency bands by use of various wireless communication schemes (e.g., long term evolution (LTE), wireless fidelity (Wi-Fi), near field communication (NFC), or Bluetooth). Moreover, the electronic device may use multiple input multiple output (MIMO) to raise the capacity of the wireless communication channel.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). The electronic device 101 may communicate with the electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121. The term "processor" shall be understood to refer to both the singular and plural contexts in this disclosure.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an image signal processor or a communication processor) may be implemented as part of another component (e.g., the camera module 180 or the communication module 190) functionally related to the auxiliary processor 123. The auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include a touch sensor adapted to detect a touch, or a pressure sensor adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a printed circuit board (PCB)). The antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. The mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. The external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, The module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

FIG. 2A is a perspective view illustrating an electronic device according to an embodiment.

FIG. 2B is a perspective view taken from back of the electronic device of FIG. 2A.

Referring to FIG. 2A and FIG. 2B, an electronic device 101 according to an embodiment may include a housing 210 including a first surface (or a front surface) 210A, a second surface (or a rear surface) 210B, and a side surface (or a sidewall) 210C which surrounds a space between the first surface 210A and the second surface 210B. In another embodiment (not shown), the housing may indicate a structure forming a part of the first surface 210A, the second surface 210B and the side surfaces 210C of FIG. 2A and FIG. 2B.

The first surface 210A of the electronic device 101 may be formed by a front plate 202 (e.g., a glass plate including various coating layers, or a polymer plate) which is at least in part transparent. In an embodiment, the front plate 202 may include a curved portion seamlessly extending from the first surface 210A toward a rear plate 211 in at least one side edge portion.

The second surface 210B may be formed by the substantially opaque rear plate 211. The rear plate 211 may be formed by, for example, coated or tinted glass, ceramic, polymer, metal (e.g., aluminum, stainless steel (STS), or magnesium), or a combination of at least two of the materials. The rear plate 211 may include a curved portion seamlessly extending from the second surface 210B toward the front plate 202 in at least one side edge portion.

The side surface 210C may be formed by a frame 215 which couples with the front plate 202 and the rear plate 211, and includes a metal and/or polymer. In another embodiment, the rear plate 211 and the frame 215 may be integrally formed, and include substantially the same material (e.g., a metal material such as aluminum).

The electronic device 101 may include at least one or more of a display 201, an audio module 170, a sensor module 204, a first camera module 205, a key input device 217, a first connector hole 208 and a second connector hole 209. In another embodiment, the electronic device 101 may omit at least one (e.g., the key input device 217) of the components or may additionally include other component. For example, a sensor such as a proximity sensor or an illuminance sensor may be integrated into the display 201 in a region provided by the front plate 202, or may be disposed adjacent to the display 201. In an embodiment, the electronic device 101 may further include a light emitting device 206, and the light emitting device 206 may be disposed at a position adjacent to the display 201 in the region provided by the front plate 202. The light emitting device 206 may provide, for example, state information of the electronic device 101 in the form of light. In another embodiment, the light emitting device 206 may provide, for example, a light source interworking with an operation of the first camera module 205. The light emitting element 206 may include, for example, a light emitting diode (LED), an infrared (IR) LED, and a xenon lamp.

The display 201 may be exposed through, for example, a substantial portion of the front plate 202. In another embodiment, the edge of the display 201 may be formed to be substantially the same as an adjacent outer shape (e.g., a curved surface) of the front plate 202. In another embodiment, to expand an area exposing the display 201, a gap between a periphery of the display 201 and a periphery of the front plate 202 may be substantially identical. In another embodiment, a recess or an opening may be formed in a part of a screen display region of the display 201, to include other electronic component aligned with the recess or the opening, for example, the first camera module 205, the proximity sensor or the illuminance sensor not shown.

In another embodiment, the display 201 may be coupled with or disposed adjacent to a touch sensing circuit, a pressure sensor for measuring touch intensity (pressure), and/or a digitizer for detecting a magnetic field type stylus pen.

In an embodiment, the audio module 170 may include a microphone hole 203, at least one speaker hole 207 and a call receiver hole 214. The microphone hole 203 may include a microphone therein for acquiring an external sound, and a plurality of microphones may be disposed to detect a sound direction in an embodiment. In another embodiment, the at least one speaker hole 207 and the call receiver hole 214 may be implemented as a single hole together with the microphone hole 203, or a speaker (e.g., a piezo speaker) may be included without the at least one speaker hole 207 and the call receive hole 214.

In an embodiment, the electronic device 101, which includes the sensor module 204, may generate an electrical signal or a data value corresponding to an internal operating state of the electronic device 101, or an external environmental state. The sensor module 204 may further include, for example, the proximity sensor disposed in the first surface 210A of the housing 210, the fingerprint sensor integrated into or disposed adjacent to the display 201, and/or a biometric sensor (e.g., a heart rate monitor (HRM) sensor) disposed in the second surface 210B of the housing 210. The electronic device 101 may include a sensor module not shown, for example, at least one of a gesture sensor, a gyro sensor, a barometric pressure sensor, a magnetic sensor, an acceleration sensor, a grip sensor, a color sensor, an IR sensor, a biometric sensor, a temperature sensor, a humidity sensor, or an illuminance sensor.

In an embodiment, the electronic device 101 may include a second camera module 255 disposed in the second surface 210B. The first camera module 205 and the second camera module 255 may include one or more lenses, an image sensor, and/or an image signal processor. A flash not shown may be disposed in the second surface 210B. The flash may include, for example, a light emitting diode or a xenon lamp. In another embodiment, two or more lenses (an infrared camera, wide angle and telephoto lenses) and image sensors may be disposed in one surface of the electronic device 101.

In an embodiment, the key input device 217 may be disposed on the side surface 210C of the housing 210. In another embodiment, the electronic device 101 may not include a part or whole of the above-mentioned key input device 217 and the key input device 217 not included may be implemented on the display 201 in a different form such as a soft key. In another embodiment, the key input device may include at least a part of the fingerprint sensor disposed in the second surface 210B of the housing 210.

In an embodiment, the connector holes 208 and 209 may include the first connector hole 208 for accommodating a connector (e.g., a universal serial bus (USB) connector) for transmitting and receiving power and/or data to and from the external electronic device, and/or the second connector hole (e.g., an earphone jack) 209 for accommodating a connector for transmitting and receiving an audio signal to and from an external electronic device.

Although FIG. 2A and FIG. 2B illustrate that the electronic device 101 corresponds to a bar-type, this is only an example and the electronic device 101 may actually correspond to various devices. For example, the electronic device 101 may correspond to a foldable device, a slidable device wearable device (e.g., a smart watch, a wireless earphone) or a tablet PC. Hence, the technical idea disclosed in this document is not limited to the bar-type device shown in FIG. 2A and FIG. 2B and may be applied to various devices.

Figure 3A:
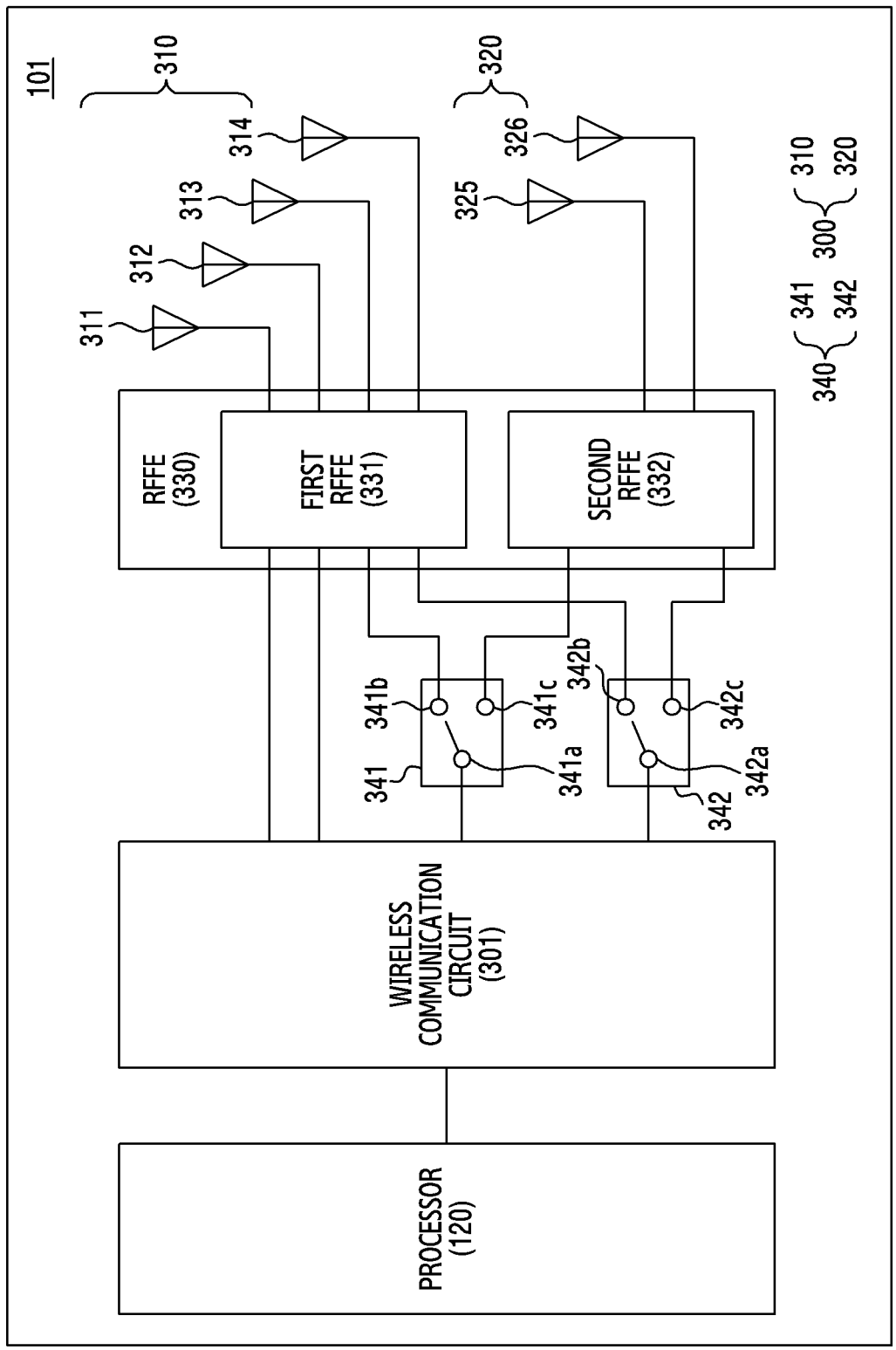
FIG. 3A is a diagram illustrating a structure in which a plurality of antennas is connected to a wireless communication circuit through a first switch circuit and a second switch circuit according to an embodiment.
Figure 3B:
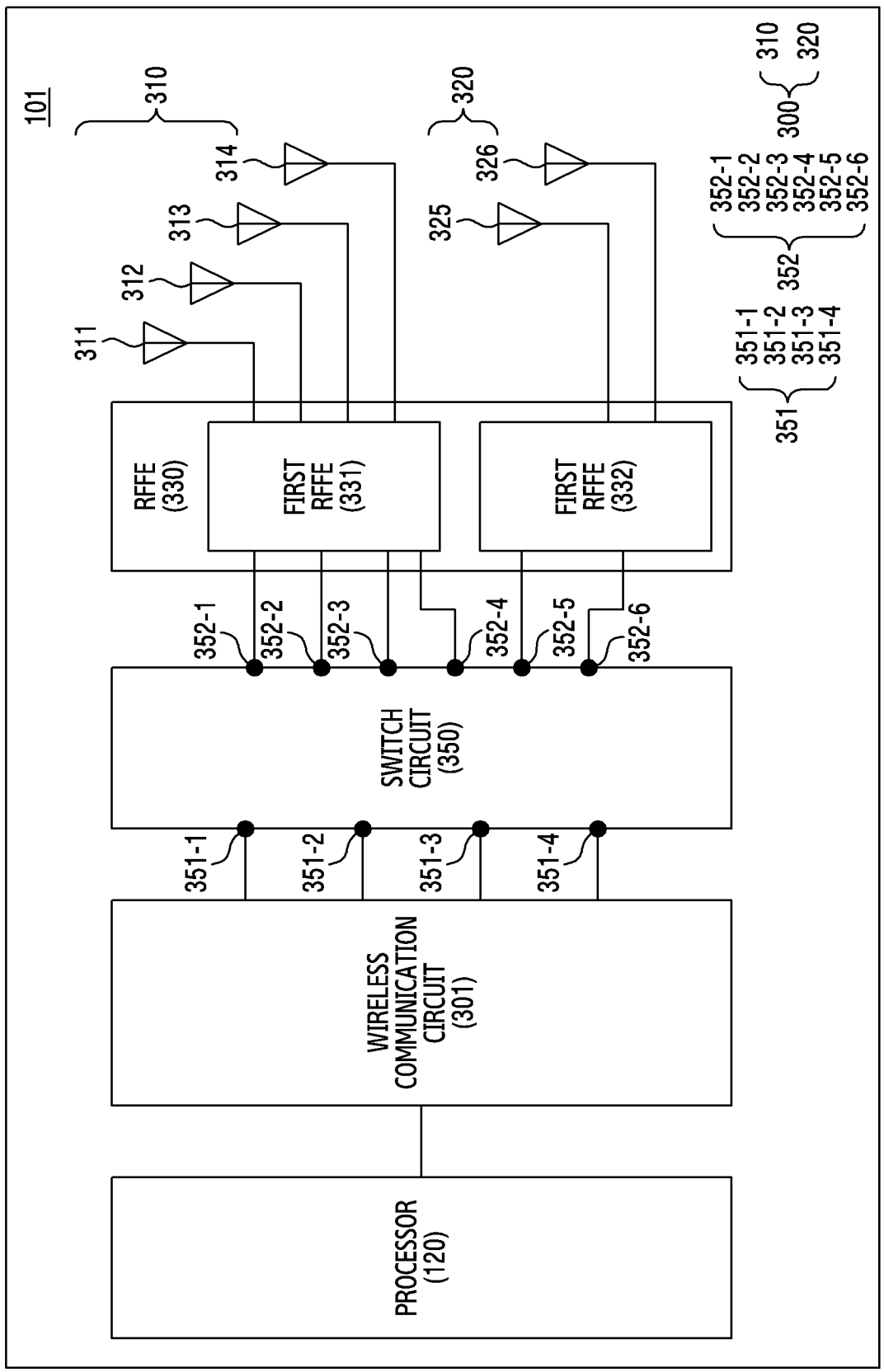
FIG. 3B is a diagram illustrating a structure in which a plurality of antennas of an electronic device is connected to a wireless communication circuit through a switch circuit according to an embodiment.

The electronic device 101 may use Multiple Input Multiple Output (MIMO) to raise the capacity of the wireless communication channel. In MIMO, multiple antennas can be used to transmit and receive communication signals. In FIGS. 3A and 3B, there are multiple Radio Frequency Front Ends (RFFE) 331, 332, each of which are connected to a plurality of antennas 310 and 320.

However, even with a signal to noise ratio (SNR) over a designated value, the wireless communication channel capacity may vary according to correlation between the plurality of the antennas, e.g., 311-314, rather than the antenna gain of each of the plurality of the antennas. The wireless communication channel capacity may decrease if there is a high correlation between the plurality of the antennas 311-314.

Accordingly, as will be explained below, at least one antenna from the second antenna group 320 may be used with some of the antennas from the first antenna group 310 to improve the data capacity of the wireless communication channel.

FIG. 3A is a diagram illustrating a structure in which a plurality of antennas is connected to a wireless communication circuit through a first switch circuit and a second switch circuit according to an embodiment.

Referring to FIG. 3A, an electronic device 101 according to an embodiment may include a processor 120, a wireless communication circuit 301, a first switch circuit 341, a second switch circuit 342, a radio frequency front end (RFFE) 330 and a plurality of antennas 300.

The plurality of the antennas 300 may include a first antenna group 310 and/or a second antenna group 320. In an embodiment, the first antenna group 310 may include two or more antennas. For example, the first antenna group 310 may include a first antenna 311, a second antenna 312, a third antenna 313 and/or a fourth antenna 314. In an embodiment, the second antenna group 320 may include at least one or more antennas. For example, the second antenna group 320 may include a fifth antenna 325 and/or a sixth antenna 326. The number of the first antenna group 310 and the second antenna group 320 shown in FIG. 3A is merely an example for convenience of the description, and the first antenna group 310 and the second antenna group 320 may include various numbers of antennas in another embodiment.

The wireless communication circuit 301 may transmit and/or receive an RF signal of a designated frequency band using the plurality of the antennas 300. For example, the wireless communication circuit 301 may transmit and/or receive an RF signal of a first frequency band using the first antenna group 310. As another example, the wireless communication circuit 301 may transmit and/or receive an RF signal of a second frequency band using the second antenna group 320. In an example, the second antenna group 320 may correspond to a diversity antenna, and the wireless communication circuit 301 may transmit and/or receive the RF signal of the first frequency band as well as the second frequency band using the second antenna group 320.

The wireless communication circuit 301 may implement multi input multi output (MIMO) using the first antenna group 310. For example, the wireless communication circuit 301 may implement 4×4 MIMO using the first antenna 311, the second antenna 312, the third antenna 313 and the fourth antenna 314.

The RFFE 330 may include a first RFFE 331 and a second RFFE 332. In an embodiment, the plurality of the antennas 300 may be electrically connected to the RFFE 330. For example, the first antenna group 310 of the plurality of the antennas 300 may be electrically connected to the first RFFE 331. As another example, the second antenna group 320 may be electrically connected to the second RFFE 332. In an embodiment, the first RFFE 331 and/or the second RFFE 332 may include various components for processing the RF signals received from the plurality of the antennas 300. For example, the first RFFE 331 and/or the second RFFE 332 may include at least one phase shifter, at least one transmission line (e.g., a waveguide, a flexible printed circuit board (FPCB)) and/or at least one low noise amplifier (LNA).

The switch module 340 may include a first switch circuit 341 and/or a second switch circuit 342. In an embodiment, the switch module 340 may be electrically connected to the wireless communication circuit 301 and the plurality of antennas 300. For example, the first switch circuit 341 may include a first terminal 341a, a second terminal 341b and/or a third terminal 341c. In one example, the first terminal 341a may be electrically connected to the wireless communication circuit 301, the second terminal 341b may be electrically connected to the third antenna 313 through the first RFFE 331, and the third terminal 341c may be electrically connected to the fifth antenna 325 through the second RFFE 332. As another example, the second switch circuit 342 may include a fourth terminal 342a, a fifth terminal 342b and/or a sixth terminal 342c. In one example, the fourth terminal 342a may be electrically connected to the wireless communication circuit 301, the fifth terminal 342b may be electrically connected to the fourth antenna 314 through the first RFFE 331, and the sixth terminal 342c may be electrically connected to the sixth antenna 326 through the second RFFE 332. In an embodiment, the first switch circuit 341 and/or the second switch circuit 342 may include a single pole double through (SPDT) switch. FIG. 3 illustrate, but not limited thereto, the switch module 340 including the SPDT switch, and the switch module 340 may include various switches in another embodiment. For example, the switch circuit may include an n pole n throw (NPNT) switch.

The processor 120 may be electrically connected to the wireless communication circuit 301. In an embodiment, the processor 120 may control the switch module 340 to control the electrical connection relationship between the wireless communication circuit 301 and the plurality of the antennas 300. For example, the first terminal 341a and the second terminal 341b of the first switch circuit 341 may be electrically connected under the control of the processor 120. In an example, the wireless communication circuit 301 may be electrically connected to the fourth antenna 314, and may not be electrically connected to the fifth antenna 325. As another example, the first terminal 341a and the third terminal 341c of the first switch circuit 341 may be electrically connected under the control of the processor 120. In an example, the wireless communication circuit 301 may not be electrically connected to the fourth antenna 314, and may be electrically connected to the fifth antenna 325.

The connection relationship between the wireless communication circuit 301 and the plurality of the antennas 300 shown in FIG. 3A is merely an example for describing a flowchart for obtaining a maximum communication channel capacity shown in FIG. 4 and the connection relationship between the wireless communication circuit 301 and the plurality of the antennas 300 allows certain embodiments. As an example, FIG. 3B illustrates connection relationship between the wireless communication circuit 301 and the plurality of the antennas 300 of the embodiment which is different from that of FIG. 3A.

FIG. 3A describes that the first switch circuit 341 and/or the second switch circuit 342 are controlled by the processor 120, but this is merely an example. For example, the first switch circuit 341 and/or the second switch circuit 342 may be controlled by the wireless communication circuit 301. As another example, the first switch circuit 341 and/or the second switch circuit 342 may operate by itself.

FIG. 3B is a diagram illustrating a structure in which the plurality of the antennas of the electronic device is connected to the wireless communication circuit through a switch circuit according to an embodiment.

Referring to FIG. 3B, a switch circuit 350 according to an embodiment may include a plurality of input ports 351 and a plurality of output ports 352. For example, the switch circuit 350 may include a first input port 351-1, a second input port 351-2, a third input port 351-3 and/or a fourth input port 351-4. As another example, the switch circuit 350 may include a first output port 352-1, a second output port 352-2, a third output port 352-3, a fourth output port 352-4, a fifth output port 352-5 and/or a sixth output port 352-6.

The plurality of the input ports 351 of the switch circuit 350 may be electrically connected to the wireless communication circuit 301. In an embodiment, the plurality of the output ports 352 of the switch circuit 350 may be electrically connected to the first antenna group 310 and the second antenna group 320. For example, the first output port 352-1 of the switch circuit 350 may be electrically connected to the first antenna 311 of the first antenna group 310, the second output port 352-2 may be electrically connected to the second antenna 312, the third output port 352-3 may be electrically connected to the third antenna 313, and the fourth output port 352-4 may be electrically connected to the fourth antenna 314. The fifth output port 352-5 may be electrically connected to the fifth antenna 325 of the second antenna group 320, and the sixth output port 352-6 may be electrically connected to the sixth antenna 326.

The processor 120 may control the switch circuit 350 to electrically connect the wireless communication circuit 301 to the plurality of the antennas 300. Unlike FIG. 3A, the wireless communication circuit 301 may be electrically connected to various combinations of antennas in an embodiment. For example, the switch circuit 350 may connect the first input port 351-1 to the third output port 352-3, connect the second input port 351-2 to the fourth output port 352-4, connect the third input port 351-3 to the fifth output port 352-5, and connect the fourth input port 351-4 to the sixth output port 352-6. In an example, as a result, the wireless communication circuit 301 may be electrically connected to the third antenna 313, the fourth antenna 314, the fifth antenna 325 and the sixth antenna 326 through the switch circuit 350, to transmit and/or receive an RF signal of a designated frequency band through the third antenna 313, the fourth antenna 314, the fifth antenna 325 and the sixth antenna 326.

FIG. 3B has described that the switch circuit 350 is controlled by the processor 120, but this is merely an example. For example, the switch circuit 350 may be controlled by the wireless communication circuit 301. As another example, the switch circuit 350 may operate by itself.

Figure 4A:
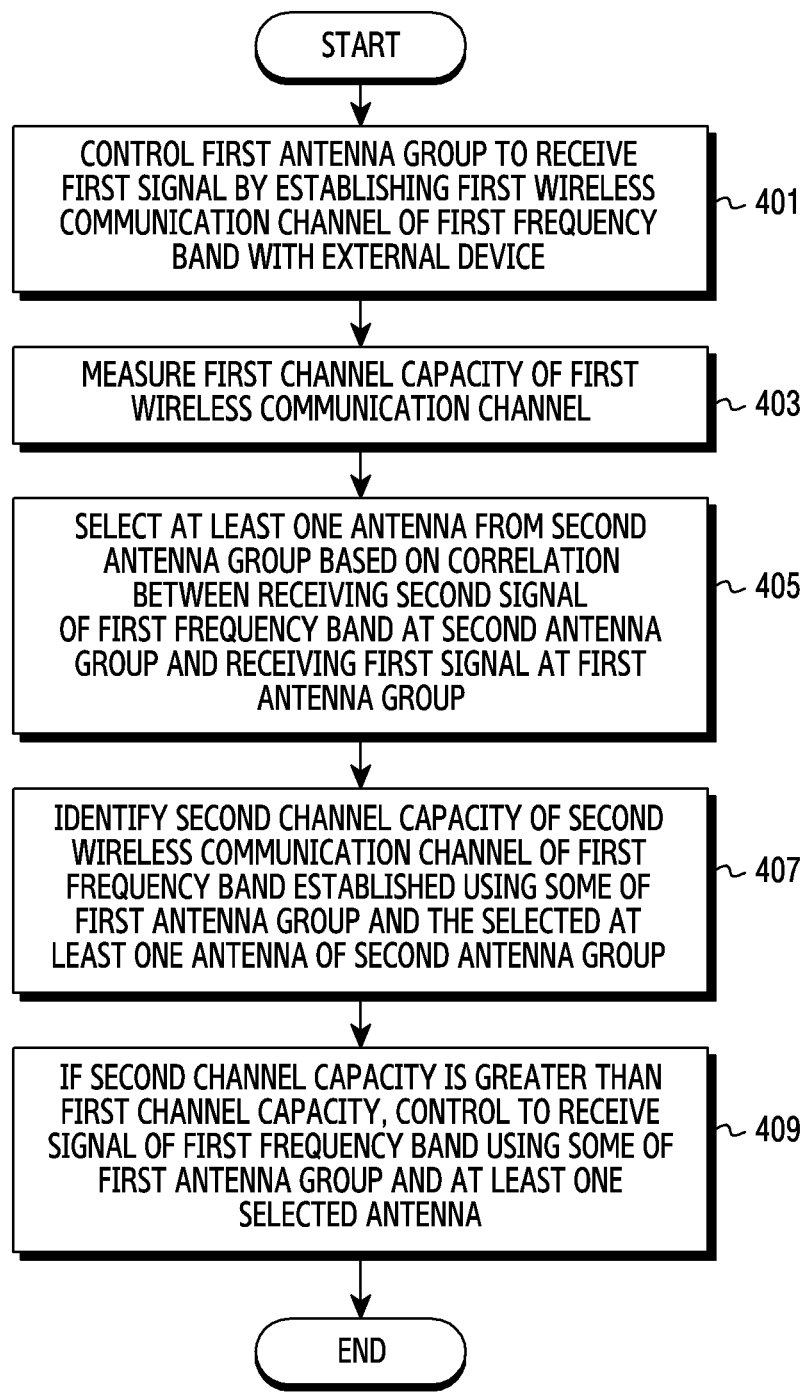
FIG. 4A is a flowchart illustrating operations of a wireless communication circuit for obtaining a maximum channel capacity by using a first antenna group and a second antenna group according to an embodiment.

FIG. 4A is a flowchart illustrating operations of a wireless communication circuit for obtaining a maximum channel capacity by using a first antenna group and a second antenna group according to an embodiment.

Referring to FIG. 4A, the wireless communication circuit 301 according to an embodiment may control the first antenna group 310 to receive a first signal by establishing a first wireless communication channel of a first frequency band with an external device in operation 401.

The wireless communication circuit 301 may measure a first channel capacity of the first wireless communication channel in operation 403. For example, the wireless communication circuit 301 may measure the channel capacity of the first wireless communication channel using the SNR value of the first signal received. In an embodiment, the first channel capacity may indicate a maximum data rate if the wireless communication circuit 301 transmits information (e.g., voice data, image data) to an external device using the first wireless communication channel.

The wireless communication circuit 301 may select at least one antenna from the second antenna group 320 based on correlation between receiving a second signal of the first frequency band at the second antenna group 320 and receiving the first signal at the first antenna group 310 in operation 405. The correlation between the antennas of the present disclosure may be determined based on a radiation pattern shape similarity between the antennas and/or a gain of each antenna (or an output radiated by each antenna).

In an embodiment, the correlation between the second signal reception of the second antenna group 320 and the first signal reception of the first antenna group 310 may be expressed as a correlation coefficient. Information of the correlation coefficient may be stored in the memory 130 of the electronic device 101, or may be stored in an external server. The wireless communication circuit 301 may obtain the correlation coefficient information from the memory 130 and/or the external server. In an embodiment, it has been described that the correlation between the antennas is expressed as the correlation coefficient, which is merely an example, and the correlation between the antennas may be expressed using various parameters.

In an embodiment of the disclosure, the wireless communication circuit 301 may identify the correlation coefficient information of the first antenna group 310 and the second antenna group 320, and the wireless communication circuit 301 may select at least one antenna (e.g., the sixth antenna 326) of the second antenna group 320 having a relatively low correlation coefficient with respect to the first antenna group 310 based on the identified information. In an embodiment, the wireless communication circuit 301 selects the antenna having the relatively low correlation coefficient with the first antenna group 310 from the second antenna group 320 because utilizing the antenna having the relatively low correlation coefficient as a diversity antenna for receiving the RF signal of the first frequency band may obtain a higher channel capacity than an antenna of a relatively high correlation coefficient. For example, the channel capacity of the wireless communication channel may be defined as the following Equation 1 under the condition that the SNR of the received signal is higher than a designated value.

$$\log(SNR \cdot G_{Rx} \cdot \alpha^2) + \log SNR \cdot G_{Rx} \cdot \beta^2 \qquad [\text{Equation 1}]$$

In Equation 1, SNR may correspond to the SNR value, $G_{Rx}$ may correspond to the antenna gain, $\alpha$ and $\beta$ may correspond to coefficients. In this case, as the correlation coefficient between the antennas lowers, the values $\alpha$ and $\beta$ may approach 1 and as the correlation coefficient between the antennas increases, the values $\alpha$ and $\beta$ may have values 2 and 0 or 0 and 2 respectively.

Referring to Equation 1, if the correlation coefficient between the antennas is low, the channel capacity may have the value $2 \cdot \log(SNR \cdot G_{Rx})$, and if the correlation coefficient between the antennas is high, the channel capacity may have the value $\log(2 \cdot SNR \cdot G_{Rx})$. As a result, the electronic device 101 may obtain a relatively higher channel capacity if the correlation coefficient between the antennas is lower compared to the high correlation coefficient.

The wireless communication circuit 301 may identify (or, estimate) a second channel capacity of a second wireless communication channel if some of the first antenna group 310 and the selected at least one antenna of the second antenna group 320 in operation 407. The term "estimate" shall be understood to also include calculating, identifying, and making an actual determination. For example, the wireless communication circuit 301 may estimate the second channel capacity of the second wireless communication channel of the first frequency band which is able to be established using the first antenna 311, the second antenna 312, and the third antenna 313 of the first antenna group 310 and the sixth antenna 326. In an embodiment, some of the first antenna group 310 and the selected at least one antenna of the second antenna group 320 may be referred to as a separate third antenna group.

According to an embodiment, if the second channel capacity is greater than the first channel capacity, the wireless communication circuit 301 may control to receive a signal of the first frequency band using some of the first antenna group 310 and the at least one selected antenna (e.g., the third antenna group) in operation 409. For example, referring to FIG. 3A, the wireless communication circuit 301 may control the fourth terminal 342a of the second switch circuit 342 to be electrically connected to the sixth terminal 342c. Hence, the wireless communication circuit 301 may not be electrically connected to the fourth antenna 314, and may be electrically connected to the sixth antenna 326. In an example, the wireless communication circuit 301 may establish the second wireless communication channel based on the first frequency band using the first antenna 311, the second antenna 312, the third antenna 313 and the sixth antenna 326, and receive an RF signal based on the second wireless communication channel. As another example, referring to FIG. 3B, the switch circuit 350 may electrically connect the first input port 351-1 to the third output port 352-3, electrically connect the second input port 351-2 to the fourth output port 352-4, electrically connect the third input port 351-3 to the fifth output port 352-5, and electrically connect the fourth input port 351-4 to the sixth output port 352-6. As a result, the wireless communication circuit 301 may be electrically connected to the third antenna 313, the fourth antenna 314, the fifth antenna 325 and the sixth antenna 326 to establish the second wireless communication channel based on the first frequency band, and receive the RF signal based on the second wireless communication channel.

FIG. 4A of the present disclosure describes that operation 401 through operation 409 are performed by the wireless communication circuit 301, but this is merely an example. For example, operation 401 through operation 409 may be performed by the processor 120.

Figure 4B:
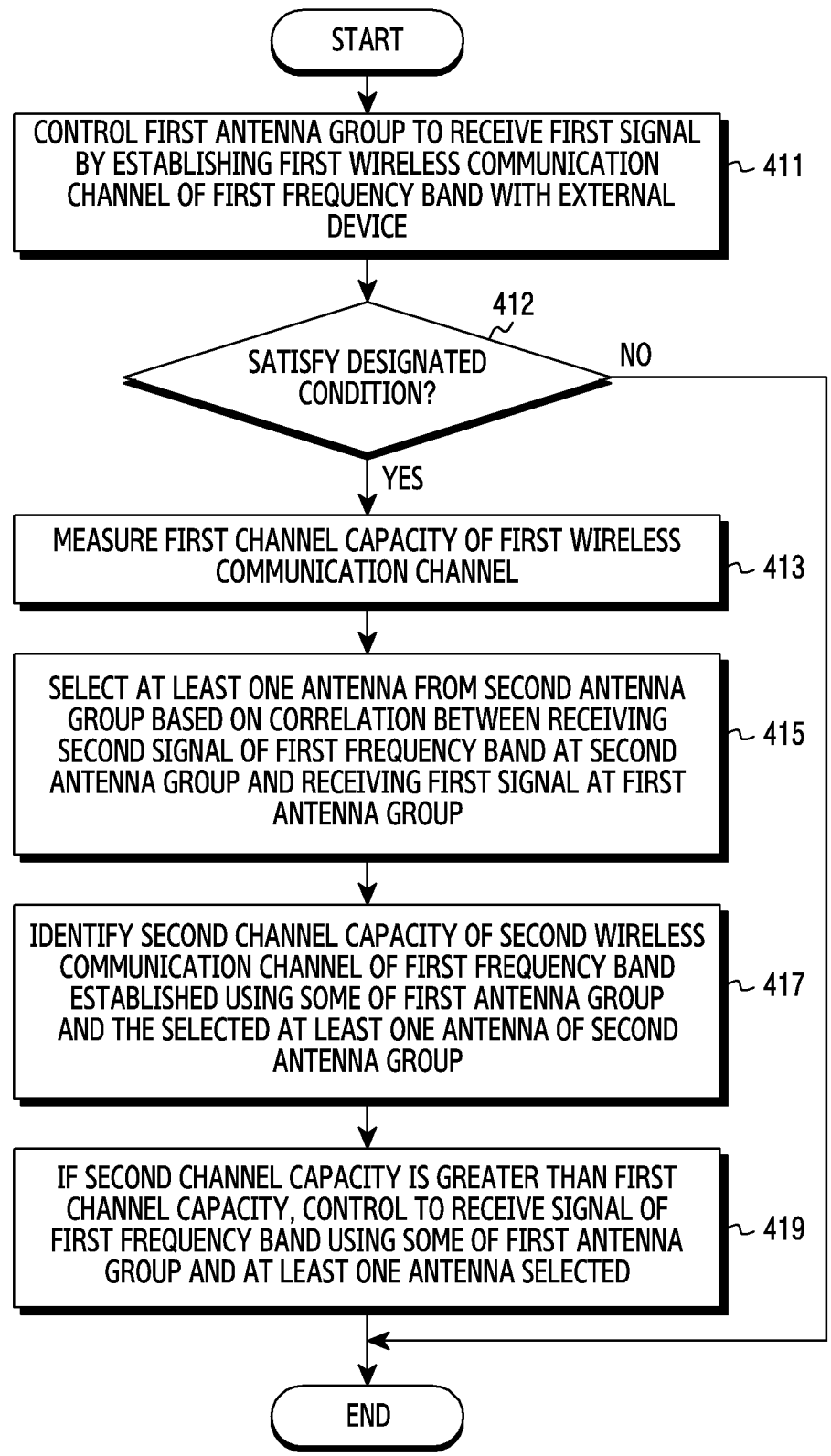
FIG. 4B is a flowchart illustrating operations of a wireless communication circuit for obtaining a maximum channel capacity by using a first antenna group and a second antenna group if a designated condition is satisfied according to an embodiment.

FIG. 4B is a flowchart illustrating operations of the wireless communication circuit for obtaining the maximum channel capacity by using the first antenna group and the second antenna group if a designated condition is satisfied according to an embodiment.

Referring to FIG. 4B, the wireless communication circuit 301 according to an embodiment may control the first antenna group 310 to receive the first signal by establishing the first wireless communication channel of the first frequency band with the external device in operation 411. Operation 411 may correspond to operation 401 of FIG. 4A.

The wireless communication circuit 301 may determine whether the first signal received satisfies a designated condition in operation 412. For example, the designated condition may include a case where a signal to noise ratio (SNR) of the first signal received by the wireless communication circuit 301 is equal to or greater than a designated value (e.g., 16 dB). In an example, if the SNR value of the received first signal is greater than or equal to the designated value, effect of the correlation between the antennas on the channel capacity may be relatively higher than the antenna gain of each of the plurality of the antennas 300. As another example, the designated condition may include a case in which an electric field intensity for receiving the first signal is greater than or equal to a designated value.

In an embodiment, the designated condition may include a plurality of conditions. For example, the designated condition may include a case where the SNR value of the received signal is equal to or greater than the designated value, and the electric field intensity is greater than or equal to the designated value.

According to an embodiment, if the wireless communication circuit 301 determines that the received first signal satisfies the designated condition, the wireless communication circuit 301 may measure the first channel capacity of the first wireless communication channel in operation 413. In an embodiment, operation 413 may correspond to operation 403 of FIG. 4A.

The wireless communication circuit 301 may select at least one antenna from the second antenna group 320 based on the correlation between receiving the second signal of the first frequency band at the second antenna group 320 and receiving the first signal at the first antenna group 310 in operation 415. In an embodiment, operation 415 may correspond to operation 405 of FIG. 4A.

The wireless communication circuit 301 may identify (or, estimate) the second channel capacity of the second wireless communication channel of the first frequency band which is able to be established using some of the first antenna group 310 and the selected at least one antenna of the second antenna group 320 in operation 417. In an embodiment, operation 417 may correspond to operation 407 of FIG. 4A.

According to an embodiment, if the second channel capacity is greater than the first channel capacity, the wireless communication circuit 301 may control to receive a signal of the first frequency band using some of the first antenna group 310 and at least one selected antenna (the third antenna group) in operation 419. In an embodiment, operation 419 may correspond to operation 409 of FIG. 4A.

Unlike FIG. 4A, the flowchart illustrated in FIG. 4B may further include determining at the wireless communication circuit 301 whether the received first signal satisfies a designated condition (e.g., operation 412). As a result, the wireless communication circuit 301 may receive the RF signal of the first frequency band using the first antenna group 310 if the received first signal does not satisfy the designated condition, and the wireless communication circuit 301 may receive the RF signal of the first frequency band by using some of the first antenna group 310 and at least one antenna selected from the second antenna group 320 if the received first signal satisfies the designated condition.

The electronic device 101 may maximize the channel capacity of the communication channel established with the external device by differing the antenna group utilized for the signal reception depending on whether the designated condition is satisfied. For example, if the designated condition (e.g., if the SNR is greater than or equal to the designated value) is not satisfied, the individual antenna gain of the plurality of the antennas 300 may have a relatively greater influence on the channel capacity increase or decrease than the correlation between the plurality of the antennas 300. Hence, if the designated condition is not satisfied, the electronic device 101 may maximize the channel capacity by improving the antenna gain of the individual antenna rather than the correlation between the plurality of the antennas 300. As another example, if the designated condition (e.g., if the SNR is greater than or equal to the designated value) is satisfied, the correlation between the plurality of the antennas 300 may exert a relatively greater influence on the channel capacity increase or decrease than the individual antenna gain of the plurality of the antennas 300. Thus, if the designated condition is satisfied, the electronic device 101 may receive the signal of the first frequency band by using some of the first antenna group 310 and at least one antenna selected from the second antenna group 320 based on the correlation (or the correlation coefficient) between the plurality of the antennas 300.

FIG. 4B has described that operation 411 through operation 419 are performed by the wireless communication circuit 301, but this is merely an example. For example, operation 401 through operation 409 may be performed by the processor 120.

Figure 4C:
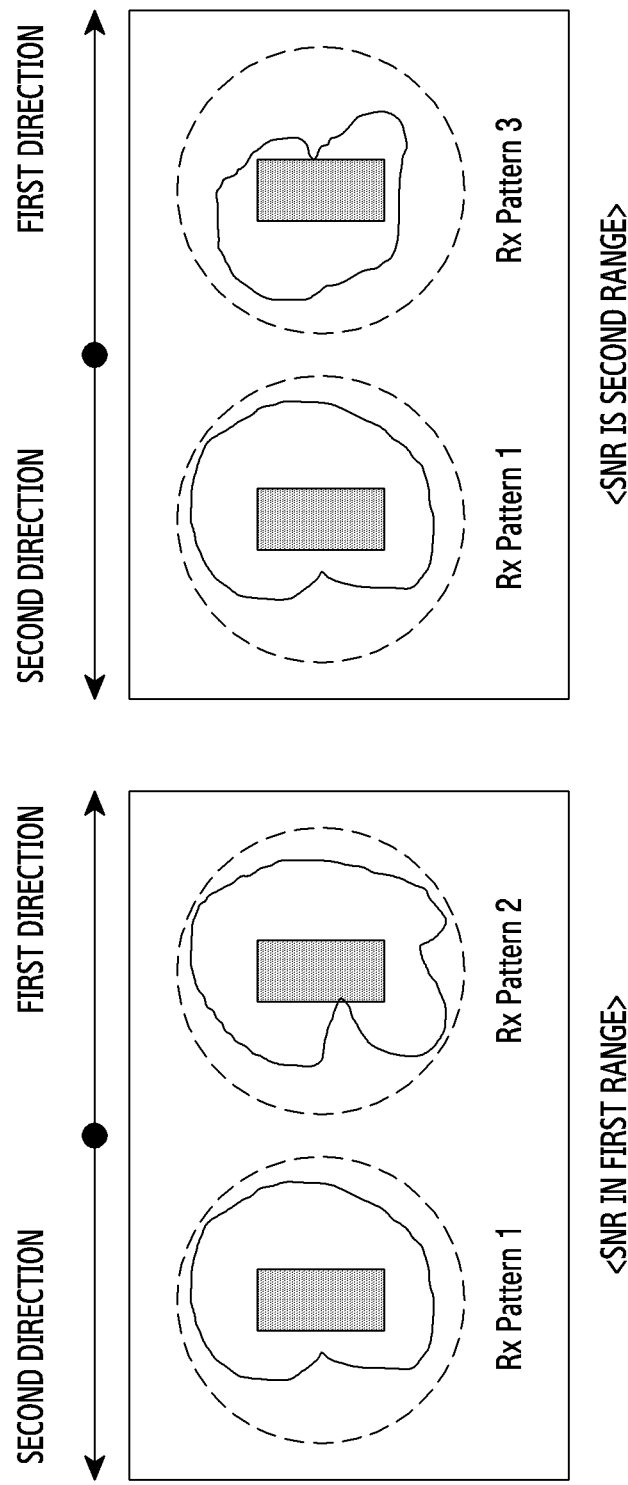
FIG. 4C is radiation patterns illustrating the flowchart of FIG. 4B according to an embodiment.

FIG. 4C is radiation patterns for illustrating the flowchart of FIG. 4B according to an embodiment.

Referring to FIG. 4C, if the SNR according to an embodiment has an appropriate value in a first range, the wireless communication circuit 301 may receive the RF signal of the first frequency band using the first antenna group 310. The radiation pattern of the first antenna group 310 may be generally formed toward a first direction. For example, a first radiation pattern (Rx pattern 1) of the first antenna 311 and a second radiation pattern (Rx pattern 2) of the second antenna 312 may be formed toward the first direction.

According to an embodiment, if the SNR has an appropriate value in a second range, the wireless communication circuit 301 may receive the RF signal of the first frequency band by using some of the first antenna group 310 and at least one antenna selected from the second antenna group 320. For example, a third radiation pattern (Rx pattern 3) of at least one antenna (e.g., the fifth antenna 325) selected from the second antenna group 320 may be formed toward a second direction.

Hence, if the SNR of the received first signal has the appropriate value of the first range, the electronic device 101 may improve the antenna gain by receiving the signal of the first frequency band using the first antenna group 310 having the radiation pattern in the first direction, thus maximizing the channel capacity. In addition, if the SNR of the received first signal has the appropriate value of the second range, the electronic device 101 may reduce the correlation coefficient between the antennas by receiving the signal of the first frequency band using the selected at least one antenna (e.g., the fifth antenna 325) having the radiation pattern in the second direction, thus maximizing the channel capacity.

Figure 5:
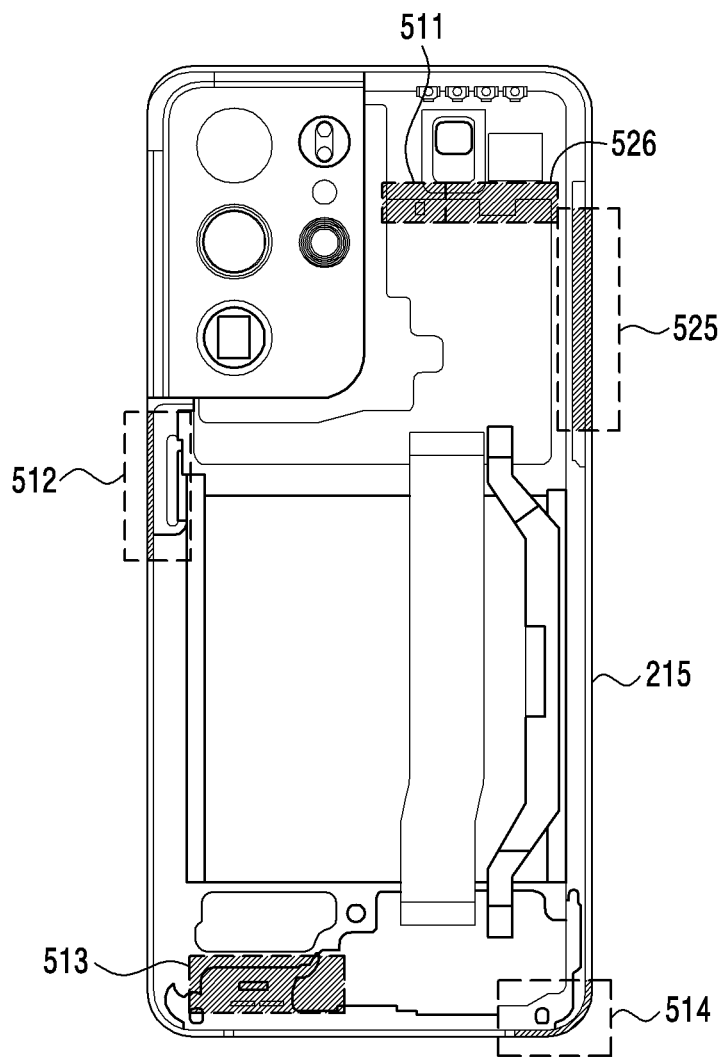
FIG. 5 is a diagram illustrating a specific example of a first antenna group and a second antenna group according to an embodiment.

FIG. 5 is a diagram illustrating a specific example of a first antenna group and a second antenna group according to an embodiment.

Referring to FIG. 5, the electronic device 101 according to an embodiment may include a plurality of antennas 500, and the plurality of the antennas 500 may include a first antenna group 510 and a second antenna group 520. In an embodiment, the first antenna group 510 may include a first antenna 511, a second antenna 512, a third antenna 513 and/or a fourth antenna 514. For example, the first antenna 511 and the third antenna 513 may correspond to a laser direct structuring (LDS) antenna. As another example, the second antenna 512 and the fourth antenna 514 may correspond to an inverted-F antenna (IFA) utilizing a part of a frame 215 which forms a side surface of the electronic device 101 as an antenna radiator. In an embodiment, the wireless communication circuit 301 may transmit and/or receive an RF signal of the first frequency band using the first antenna 511, the second antenna 512, the third antenna 513 and/or the fourth antenna 514. The wireless communication circuit 301 may implement the MIMO using the first antenna 511, the second antenna 512, the third antenna 513 and/or the fourth antenna 514.

In an embodiment, the second antenna group 520 may include a fifth antenna 525 and/or a sixth antenna 526. For example, the fifth antenna 525 may correspond to an IFA utilizing a part of the frame 215 as an antenna radiator, and the sixth antenna 526 may correspond to an LDS antenna.

The wireless communication circuit 301 may transmit and/or receive an RF signal of the first frequency band using the first antenna group 510.

The wireless communication circuit 301 may transmit and/or receive an RF signal of the second frequency band using the second antenna group 520. In addition, the wireless communication circuit 301 may transmit and/or receive an RF signal of the first frequency band using the second antenna group 520 as a diversity antenna.

The first antenna group 510 and the second antenna group 520 shown in FIG. 5 may be specific examples of the first antenna group 310 and the second antenna group 320 described in FIG. 3. Accordingly, the description on the first antenna group 310 and the second antenna group 320 aforementioned in FIG. 3 may be applied substantially to the first antenna group 510 and the second antenna group 520 according to an embodiment.

In addition, the first antenna group 510 and the second antenna group 520 shown in FIG. 5 are only exemplary, and in practice, the first antenna group 510 and the second antenna group 520 each may include antennas of various numbers and various types. For example, in another embodiment, the first antenna of the first antenna group 510 may correspond to a patch antenna, a monopole antenna, a dipole antenna and/or a slot antenna.

In addition, the arrangement structure of the first antenna group 510 and the second antenna group 520 shown in FIG. 5 is merely the example, and in practice, the first antenna group 510 and the second antenna group 520 may be disposed at various positions in the electronic device 101. For example, the electronic device 101 may include a first side surface, a second side surface perpendicular to the first side surface and a third side surface perpendicular to the second side surface and parallel to the first side surface. In an example, the first antenna group 510 may be disposed adjacent to the first side surface of the electronic device 101, and the second antenna group 520 may be disposed adjacent to the third side surface.

Hereafter, a detailed example of the first antenna group 510 and the second antenna group 520 applied to the flowchart of FIG. 4A shall be described.

The wireless communication circuit 301 according to an embodiment may control the first antenna group 510 to receive a first signal by establishing the first wireless communication channel of the first frequency band with an external device. This may correspond to operation 401.

In an embodiment, the wireless communication circuit 301 may measure the first channel capacity of the first wireless communication channel using the first antenna group 510. This may correspond to operation 403.

In an embodiment, the wireless communication circuit 301 may select at least one antenna from the second antenna group 520 based on the correlation between receiving the second signal of the first frequency band at the second antenna group 520 and receiving the first signal at the first antenna group 510. The correlation may be expressed as the correlation coefficient, and the correlation coefficient or correlation information may be stored in the memory 130.

The memory (e.g., the memory 130 of FIG. 1) may store the correlation coefficient information of the first antenna group and the second antenna group stored in the form of a look-up table (LUT) as shown in Table 1 and Table 2 below. The correlation between the antennas disclosed in this document may be determined based on the radiation pattern similarity between the antennas and/or the gain of each antenna (or the output of each antenna). In addition, in an embodiment, it has been described that the correlation is expressed by, but not limited thereto, the correlation coefficient, and the correlation may be expressed in practice with various parameters.

In an embodiment, the wireless communication circuit 301 may obtain the LUTs of the correlation coefficients of the first antenna group 510 and the second antenna group 520 from the memory 130, and select at least one antenna of the second antenna group 520 determined to obtain a relatively high channel capacity based on the obtained LUTs. The correlation coefficient of the first antenna group 510 and the second antenna group 520 may be a value considering the antenna gain (or the output radiated by the antenna) of each antenna included in the first antenna group 510 and the second antenna group 520, as well as the correlation between the antennas. An example of selecting at least one antenna of the second antenna group 520 using Table 1 and Table 2 is as follows.

Table 1 is a first LUT including the correlation coefficient information between the antennas of the first antenna group 510.

Table 2 is a second LTE including the correlation coefficient information between the first antenna 511 and the second antenna 512 of the first antenna group 510 and the fifth antenna 525 and the sixth antenna 526 of the second antenna group 520. The correlation coefficient between the antennas described in the present disclosure may be the value considering the antenna gain of each of the antennas (or the output radiated by each antenna), as well as the correlation between the antennas.

TABLE 1

| Correlation coefficient | First antenna | Second antenna | Third antenna | Fourth antenna |
|---|---|---|---|---|
| First antenna | 0.8885 | 0.8788 | 0.8669 | 0.2316 |
| Second antenna | 0.8788 | 0.8698 | 0.856 | 0.2237 |
| Third antenna | 0.8669 | 0.856 | 0.8541 | 0.2447 |
| Third antenna | 0.2316 | 0.2237 | 0.2447 | 0.1204 |

TABLE 2

| Correlation coefficient | First antenna | Second antenna | Fifth antenna | Sixth antenna |
|---|---|---|---|---|
| First antenna | 0.8885 | 0.8788 | 0.1854 | 0.1092 |
| Second antenna | 0.8788 | 0.8698 | 0.1319 | 0.2897 |
| Fifth antenna | 0.1854 | 0.1319 | 0.1679 | 0.1166 |
| Sixth antenna | 0.1092 | 0.2897 | 0.1166 | 0.7451 |

Referring to Table 1 and Table 2, the fifth antenna 525 and the sixth antenna 526 have relatively lower correlation coefficient values with respect to the first antenna 511 and the second antenna 512 than the third antenna 513 and the fourth antenna 514. For example, the fifth antenna 525 has the correlation coefficient value of 0.1854 with the first antenna 511, but the third antenna 513 has the correlation coefficient value of 0.8669 with the first antenna 511. As another example, the sixth antenna 526 has the correlation coefficient value of 0.1092 with the first antenna 511, but the fourth antenna 514 has the correlation coefficient value of 0.2316 with the second antenna 512. As a result, if receiving the signal of the first frequency band by using the first antenna group 510 and the second antenna group 520, the electronic device 101 may obtain a relatively greater channel capacity than receiving the signal of the first frequency band using only the first antenna group 510. Hence, the wireless communication circuit 3010 may select the first antenna 511, the second antenna 512, the fifth antenna 525 and the sixth antenna 526 as the third antenna group based on the LUTs, which may correspond to operation 405.

The wireless communication circuit 301 may estimate the second channel capacity of the second wireless communication channel of the first frequency band which is able to be established using some of the first antenna group 510 and at least one antenna (the third antenna group) selected from the second antenna group 520, which may correspond to operation 407.

According to an embodiment, if the second channel capacity is greater than the first channel capacity, the wireless communication circuit 301 may control to receive a signal of the first frequency band using some of the first antenna group 310 and at least one selected antenna (the third antenna group), which may correspond to operation 409.

Figure 6:
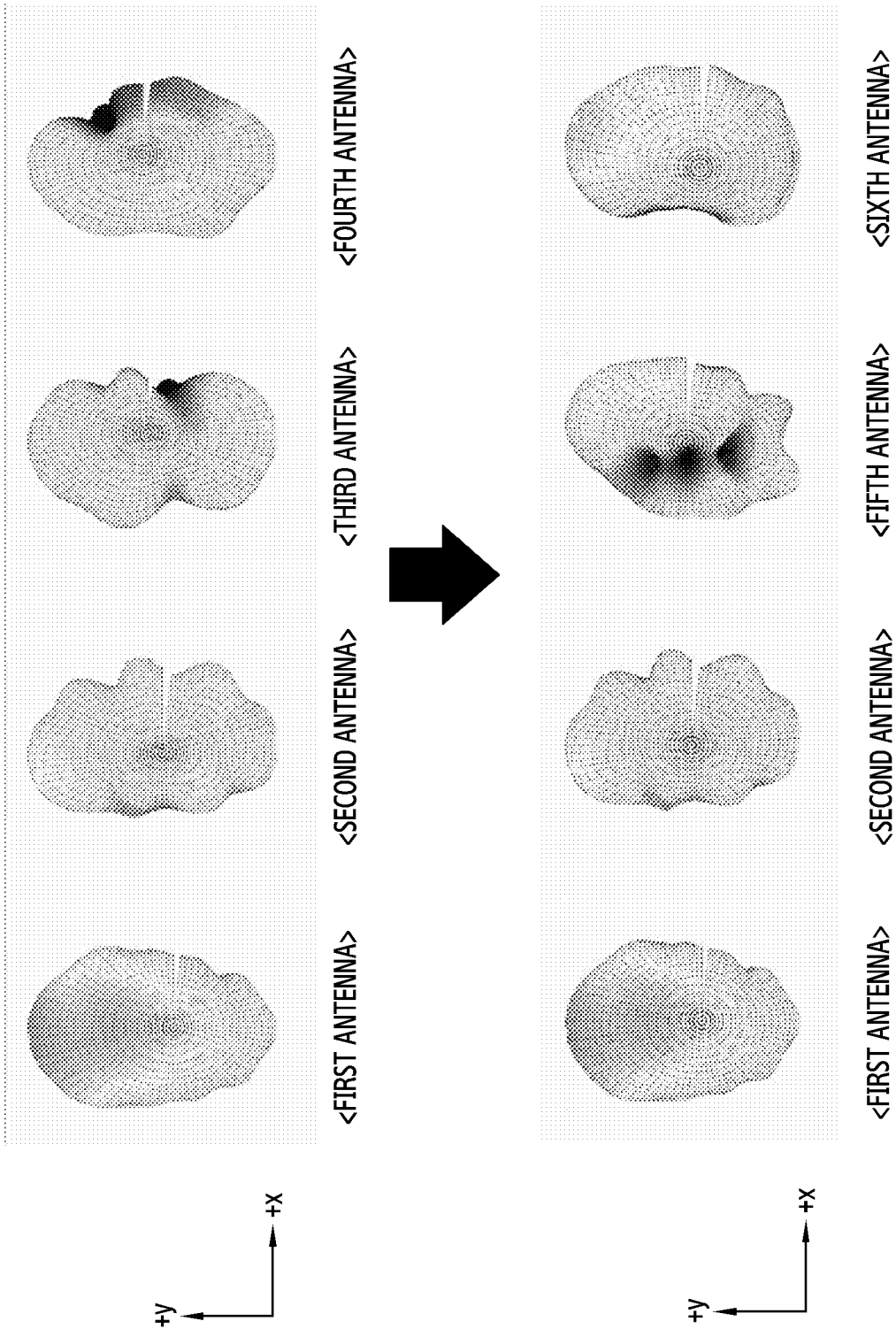
FIG. 6 is a diagram illustrating radiation patterns of a plurality of antennas according to an embodiment.

FIG. 6 is a diagram illustrating radiation patterns of a plurality of antennas according to an embodiment.

Referring to FIG. 6, the radiation patterns of the first antenna 511, the second antenna 512, the third antenna 513 and/or the fourth antenna 514 of the first antenna group 510 according to an embodiment may generally face the −x-axis direction. By contrast, the radiation patterns of the fifth antenna 525 and/or the sixth antenna 526 of the second antenna group 520 may face the +x direction relative to the radiation patterns of the first antenna group 510. In an embodiment, if the radiation pattern of the fifth antenna 525 may overlap with the radiation pattern of the first antenna compared to the radiation pattern of the third antenna 513. In addition, compared to the radiation pattern of the fourth antenna 514, the radiation pattern of the sixth antenna 526 may relatively less overlap with the radiation pattern of the first antenna.

In conclusion, if using the first antenna 511 and the second antenna 512 of the first antenna group 510 and the fifth antenna 525 and the sixth antenna 526 of the second antenna group 520, the electronic device 101 may minimize the radiation pattern overlapping between the antennas. Less overlapping of the radiation pattern may indicate that low correlation between the antennas, and the electronic device 101 may obtain a relatively high channel capacity by receiving the RF signal using the antennas having the low correlation coefficient.

Figure 7:
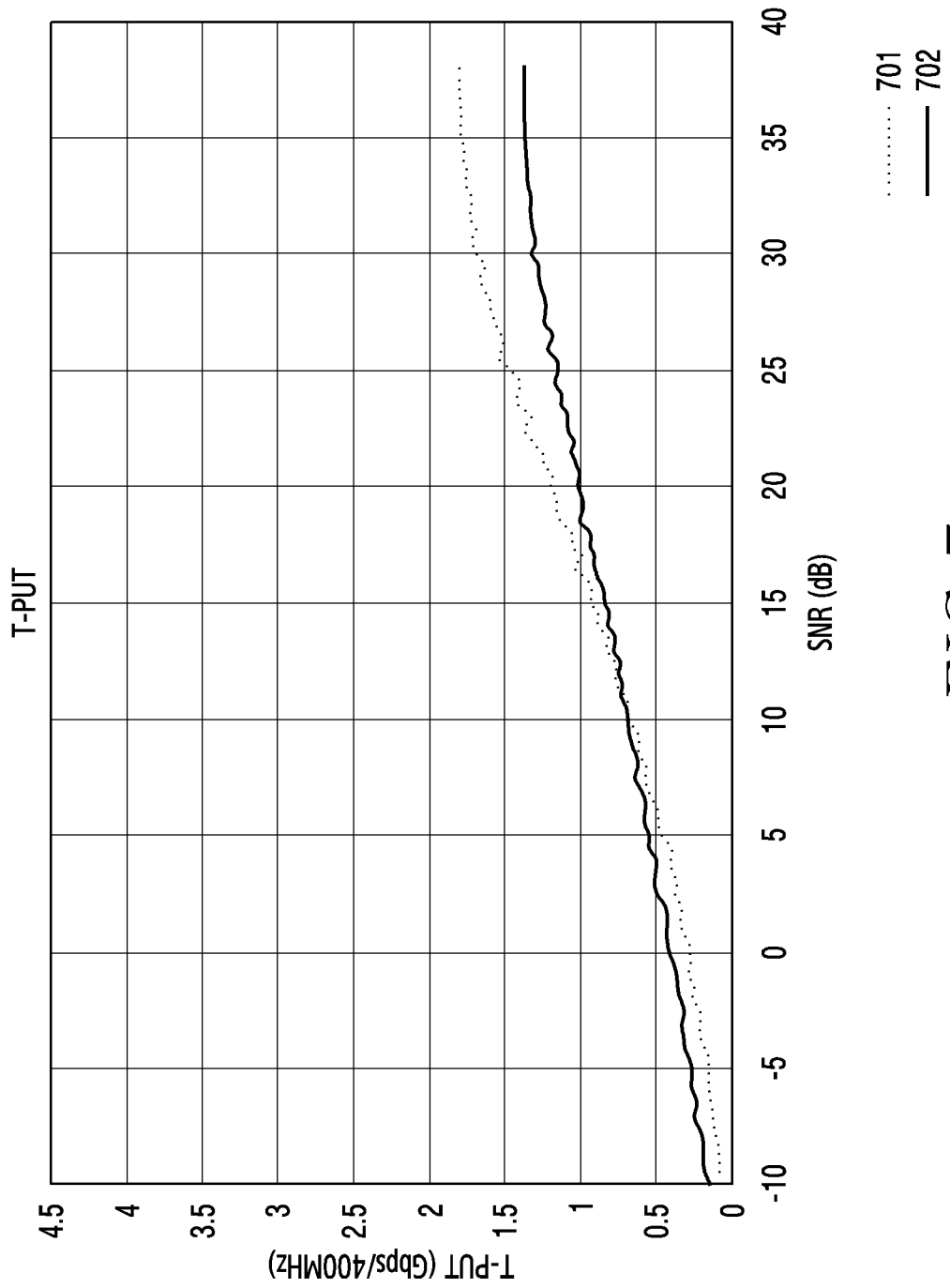
FIG. 7 is a diagram illustrating a channel capacity based on a signal to noise ratio (SNR) if a wireless communication circuit receives a signal of a first frequency band using antenna groups according to an embodiment.

FIG. 7 is a diagram illustrating a channel capacity based on an SNR if a wireless communication circuit receives a signal of a first frequency band using antenna groups according to an embodiment.

Referring to FIG. 7, a first graph 701 according to an embodiment shows the channel capacity based on the SNR if the wireless communication circuit 301 receives the signal of the first frequency band using the third antenna group. The third antenna group may include some of the first antenna group 510 and at least one antenna selected from the second antenna group 520. In an embodiment, a second graph 702 shows the channel capacity based on the SNR if the wireless communication circuit 301 receives the signal of the first frequency band using only the first antenna group 510.

According to an embodiment, if the SNR is equal to or greater than a designated value (e.g., 15 dB), the second graph 702 may have the higher channel capacity value than the first graph 701. Hence, if the electronic device 101 receives the RF signal of the first frequency band using the third antenna group under a designated condition, the electronic device 101 may obtain a higher channel capacity than using only the first antenna group 510. In an embodiment, the designated condition may include, for example, a case in which the SNR of the received signal is higher than the designated value and/or a case in which the intensity of the electric field for signal reception is greater than or equal to a designated value.

Figure 8:
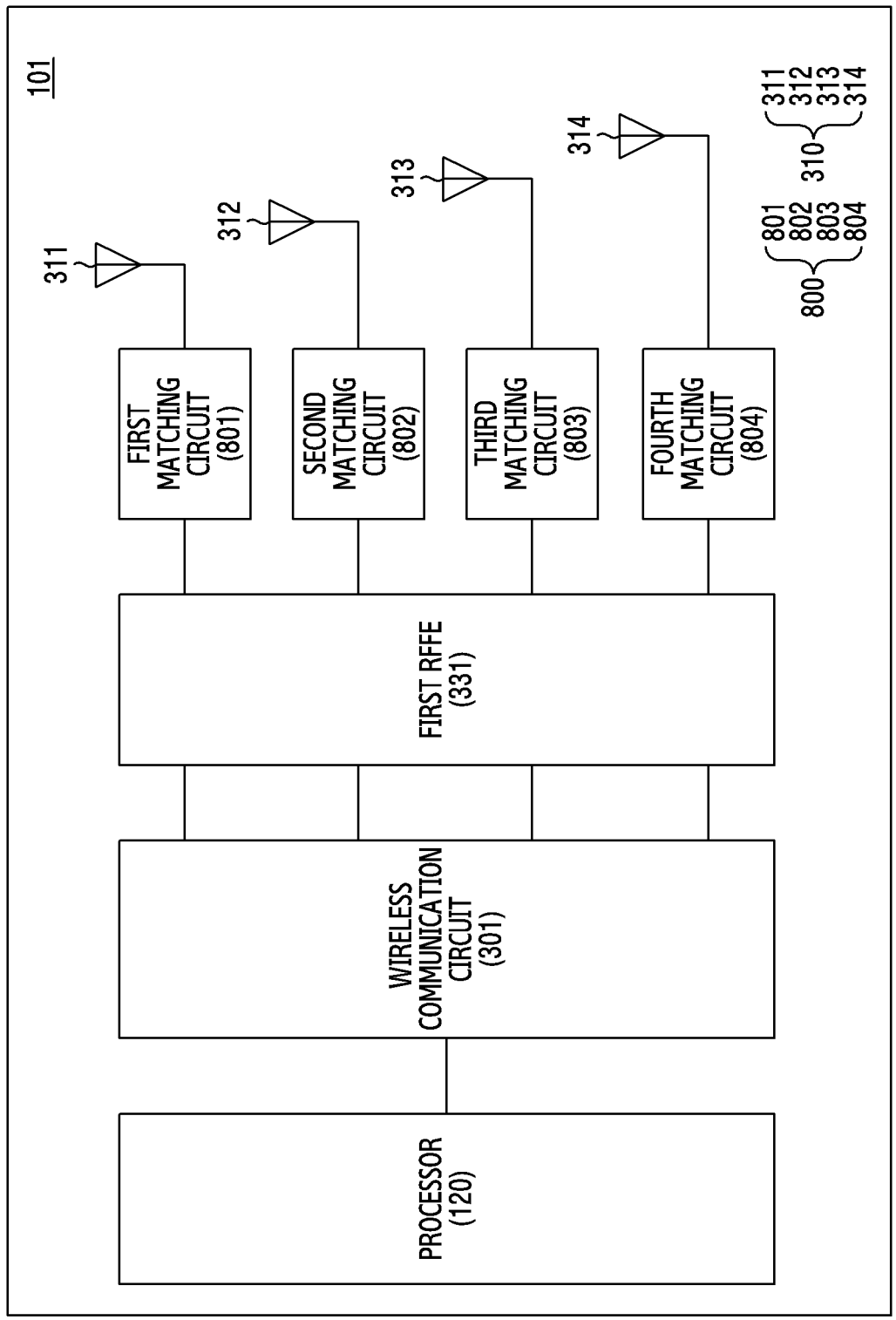
FIG. 8 is a diagram illustrating a plurality of matching circuits electrically connected with a plurality of antennas according to an embodiment.

FIG. 8 is a diagram illustrating a plurality of matching circuits electrically connected to a plurality of antennas according to an embodiment.

Referring to FIG. 8, the electronic device 101 according to an embodiment may include a plurality of matching circuits 800. For example, the electronic device 101 may include a first matching circuit 801 electrically connected to the first antenna 311, a second matching circuit 802 electrically connected to the second antenna 312, a third matching circuit 803 electrically connected to the third antenna 313 and/or a fourth matching circuit 804 electrically connected to the fourth antenna 314. In an embodiment, the plurality of the matching circuits 800 may perform impedance matching of the corresponding antenna. In an embodiment, the first matching circuit 801, the second matching circuit 802, the third matching circuit 803 and/or the fourth matching circuit 804 each may include a plurality of lumped elements.

Although the embodiment of FIG. 8 illustrates that the plurality of the matching circuits 800 is distinguished from the first RFFE 331, which is an example, and the plurality of the matching circuits 800 may be in practice included in the first RFFE 331. FIG. 8 illustrates the matching circuits 800 connected to the first antenna group 310 for convenience of description, but the matching circuits 800 may be implemented as one matching circuit in another embodiment.

The plurality of the matching circuits 800 may include a lumped element (e.g., a capacitor, an inductor). In an embodiment, the wireless communication circuit 301 may control the plurality of the matching circuits 800 based on the correlation coefficient information of the first antenna groups 310. For example, the wireless communication circuit 301 may obtain from the memory 130 the LUT including the correlation coefficient information between the first antenna 311 and the fourth antenna 314. In an example, the wireless communication circuit 301 may control the first matching circuit 801 to adjust an electrical length D1 of the first antenna 311, thus relatively lowering the correlation coefficient between the first antenna 311 and the fourth antenna 314. As another example, the wireless communication circuit 301 may control the second matching circuit 802 to adjust an electrical length D2 of the second antenna 312, thus lowering the correlation coefficient between the second antenna 312 and the other antennas. As yet another example, the wireless communication circuit 301 may control the third matching circuit 803 to adjust an electrical length L3 of the third antenna 313, thus lowering the correlation coefficient between the third antenna 313 and the other antennas. As still another example, the wireless communication circuit 301 may control the fourth matching circuit 804 to adjust an electrical length L4 of the fourth antenna 314, thus lowering the correlation coefficient between the fourth antenna 314 and the other antennas.

Hence, the electronic device 101 may lower the correlation coefficient of the first antenna group 310 through the impedance matching associated with the antennas of the first antenna group 310. As a result, the electronic device 101 may increase the channel capacity of the first wireless communication channel based on the first antenna group 310.

Figure 9:
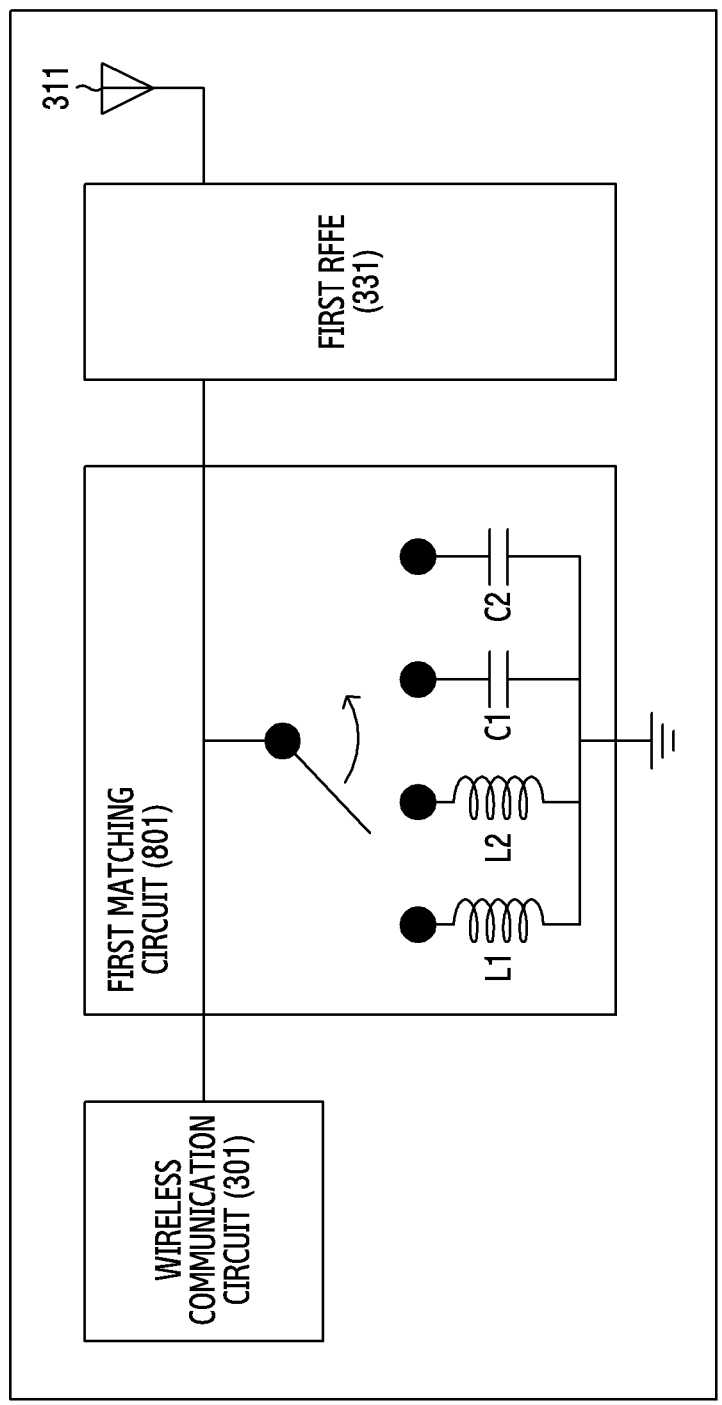
FIG. 9 is a diagram illustrating an internal structure of a first matching circuit according to an embodiment.

FIG. 9 is a diagram illustrating an internal structure of a first matching circuit according to an embodiment.

Referring to FIG. 9, a first matching circuit 801 according to an embodiment may include at least one lumped element. For example, the first matching circuit 801 may include a first inductor L1, a second inductor L2, a first capacitor C1 and/or a second capacitor C2. In an embodiment, the first inductance of the first inductor L1 may have a different value from the second inductance of the second inductor L2. In an embodiment, the first capacitance of the first capacitor C1 may have a value different from the second capacitance of the second capacitor C2.

The wireless communication circuit 301 may control the first matching circuit 801 to adjust the electrical length D1 of the first antenna 311. For example, if the first antenna 311 is electrically connected to the first inductor L1 in the first matching circuit 801, the electrical length D1 of the first antenna 311 may be relatively longer than connecting the first antenna 311 to the first capacitor C1. As the electrical length D1 increases, the radiation pattern of the first antenna 311 if the first antenna 311 receives the signal of the first frequency band may vary, and the correlation coefficient between the other antennas in the first antenna group 310 may reduce.

FIG. 9 is merely the example for explaining the configuration of the matching circuit, and the matching circuit may be practically implemented with various topologies in various configurations (e.g., a variable capacitor, a switch). For example, the matching circuit may include a variable capacitor, an additional inductor and/or an additional switch in another embodiment, and the matching circuit may be connected in series and/or in parallel to a circuit interconnecting the wireless communication circuit 301 and the first RFFE 331.

Figure 10:
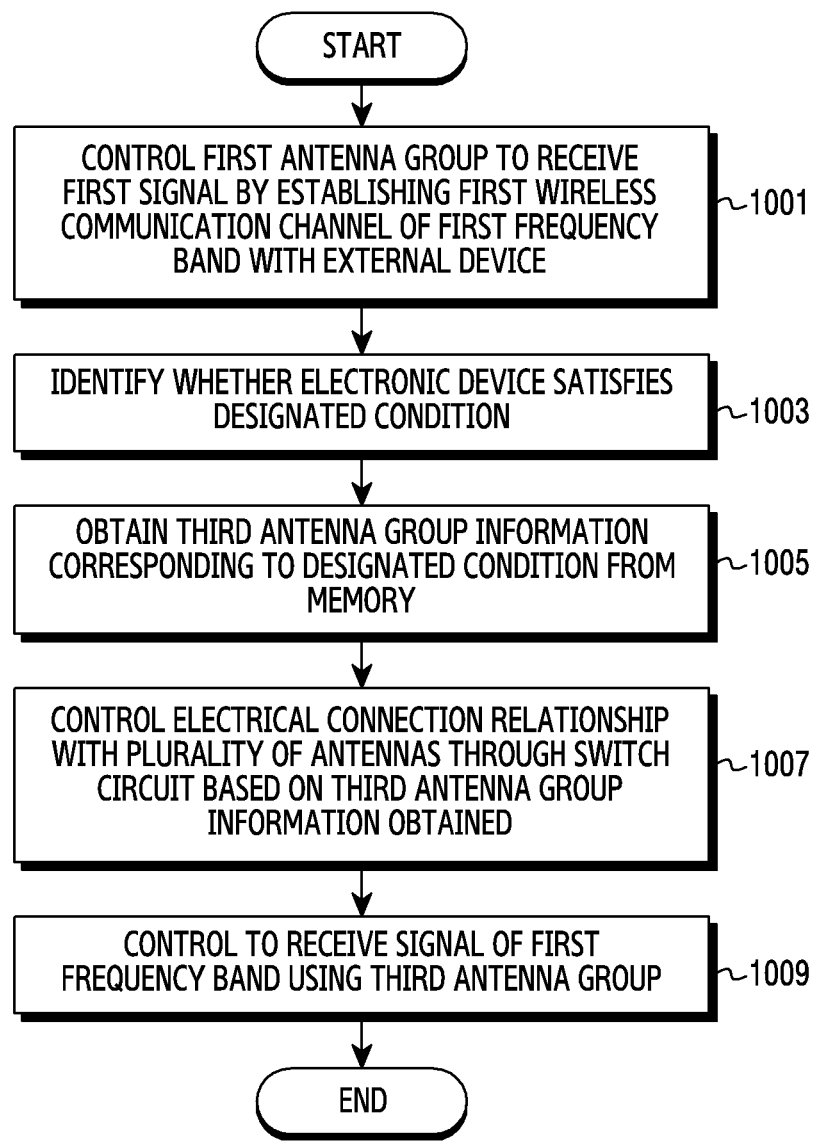
FIG. 10 is a flowchart of a wireless communication circuit for receiving an RF signal of a first frequency band using a third antenna group having a maximum channel capacity without channel capacity measurement according to an embodiment.

FIG. 10 is a flowchart of a method for receiving an RF signal of a first frequency band using a third antenna group having a maximum channel capacity without channel capacity measurement according to an embodiment.

In an embodiment, unlike the embodiment shown in FIG. 4A, the memory 130 may store combination information of antennas having a maximum channel capacity under a designated condition, and accordingly the wireless communication circuit 301 may receive a signal of the first frequency band using a combination of the antennas having the maximum channel capacity without the separate channel capacity measurement of the first wireless communication channel. The above description is to explain the difference between FIG. 4A and FIG. 10 and does not intend to separate the embodiment of FIG. 4A and the embodiment of FIG. 10. Hence, the embodiment of FIG. 4A and the embodiment of FIG. 10 may be combined if not conflicting with each other.

Referring to FIG. 10, the wireless communication circuit 301 according to an embodiment may control the first antenna group 310 to receive the first signal by establishing the first wireless communication channel of the first frequency band with the external device in operation 1001.

The wireless communication circuit 301 may identify whether the electronic device 101 satisfies a designated condition in operation 1003. In an embodiment, the designated condition may include a condition in which the SNR of the received first signal has a designated value (e.g., 16 dB), a condition in which the electric field intensity of the received first signal has a designated value and/or a condition arbitrarily set by the user.

The wireless communication circuit 301 may obtain information of the third antenna group corresponding to the designated condition from the memory 130 in operation 1005. For example, the memory 130 may store combination information of the plurality of the antennas 300 corresponding to the designated condition (e.g., the SNR value of the received first signal corresponds to about 16 dB). In storing the combination information of the plurality of the antennas 300 in the memory 130, for example, the wireless communication circuit 301 may identify the channel capacity relatively higher than other antenna combinations if receiving the RF signal of the first frequency band by use of the first antenna 311, the second antenna 312, the fifth antenna 325 and the sixth antenna 326 in consideration of the correlation coefficient of the first antenna group 310 and the second antenna group 320 if the SNR value is 16 dB. In an example, the wireless communication circuit 301 may store information of the third antenna group including the first antenna 311, the second antenna 312, the fifth antenna 325 and the sixth antenna 326 corresponding to the designated condition in the memory 130.

In an example, if the electronic device 101 satisfies the designated condition, the wireless communication circuit 301 may obtain the third antenna group information pre-stored in the memory 130.

The wireless communication circuit 301 may control the electrical connection relationship between the first antenna group 310 and the second antenna group 320 through the switch circuit 350 based on the obtained third antenna group information in operation 1007. For example, referring to FIG. 3B, the wireless communication circuit 301 may electrically connect the plurality of the input ports 351, the first output port 352-1, the second output port 352-2, the fifth output port 352-5 and the sixth output port 352-6 based on the obtained combination information of the antennas. In this case, the wireless communication circuit 301 may be electrically connected to the first antenna 311, the second antenna 312, the fifth antenna 325 and the sixth antenna 326 through the switch circuit 350.

The wireless communication circuit 301 may receive the RF signal of the first frequency band through the third antenna group including the first antenna 311, the second antenna 312, the fifth antenna 325 and the sixth antenna 326 in operation 1007.

Although FIG. 10 of the present disclosure describes that operation 1001 through operation 1009 are performed by the wireless communication circuit 301, this is merely the example. For example, operation 1001 through operation 1009 may be performed by the processor 120.

Figure 11:
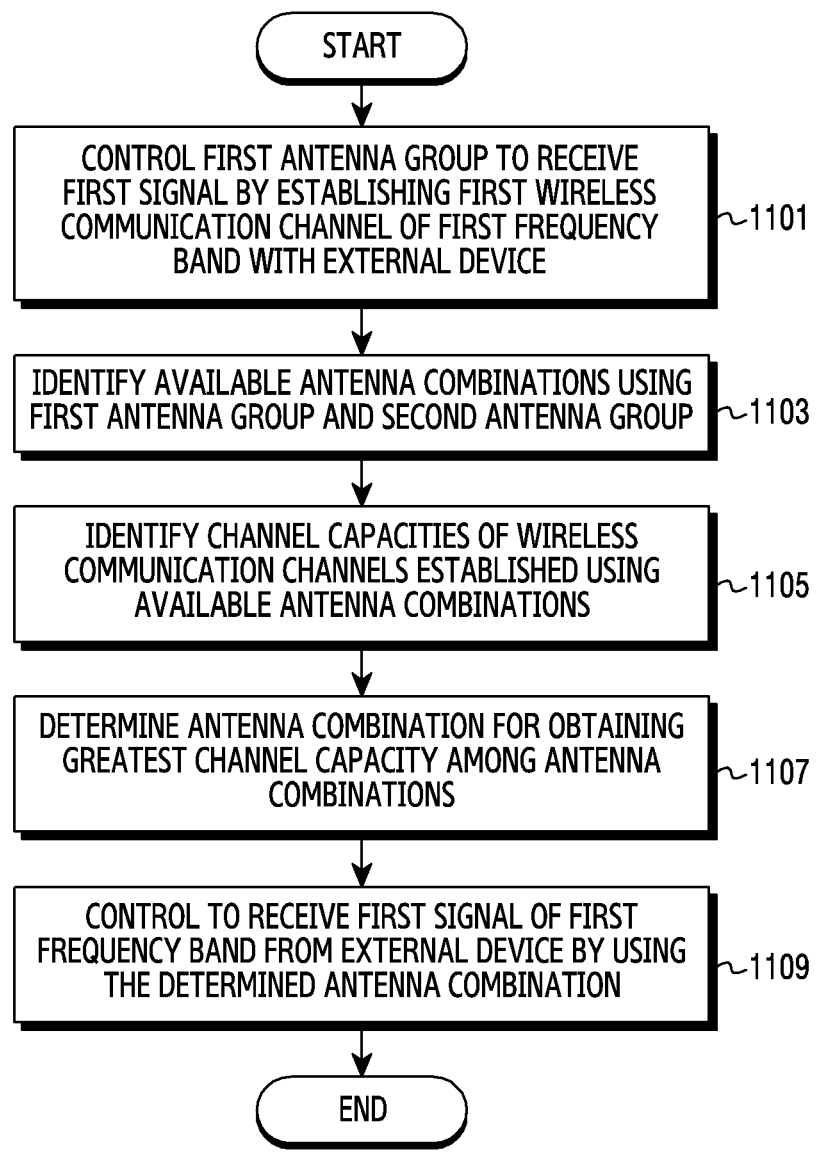
FIG. 11 illustrates a flowchart of a wireless communication circuit for receiving a signal of a first frequency band through an antenna combination having the greatest channel capacity by identifying available antenna combinations according to an embodiment.

FIG. 11 illustrates a flowchart of a wireless communication circuit for receiving a signal of a first frequency band through an antenna combination having the greatest channel capacity by identifying available antenna combinations according to an embodiment.

Referring to FIG. 11, the wireless communication circuit 301 according to an embodiment may control the first antenna group 310 to receive a first signal by establishing the first wireless communication channel of the first frequency band with the external device in operation 1101.

The wireless communication circuit 301 may identify available antenna combinations using the first antenna group 310 and the second antenna group 320 in operation 1103. For example, if the wireless communication circuit 301 implements 4×4 MIMO, the wireless communication circuit 301 may identify available antenna combinations with the first antenna 311, the second antenna 312, the third antenna 313, the fourth antenna 314, the fifth antenna 325 and the sixth antenna 326. In an example, 15 antenna combinations may be identified.

The wireless communication circuit 301 may identify (or estimate) channel capacities of wireless communication channels which may be established using the available antenna combinations in operation 1105. For example, the wireless communication circuit 301 may identify the channel capacities of the wireless communication channels which may be established using the 15 antenna combinations.

The wireless communication circuit 301 may determine an antenna combination for obtaining the greatest channel capacity among the antenna combinations in operation 1107. For example, the wireless communication circuit 301 may determine the antenna combination for obtaining the greatest channel capacity among the 15 antenna combinations. For example, the wireless communication circuit 301 may determine a combination of the first antenna 311, the second antenna 312, the fifth antenna 325 and the sixth antenna 326 as the antenna combination for obtaining the greatest channel capacity.

The wireless communication circuit 301 may control to receive the first signal of the first frequency band from the external device by using the determined antenna combination in operation 1109. For example, the wireless communication circuit 301 may receive the first signal of the first frequency band using the first antenna 311, the second antenna 312, the fifth antenna 325 and the sixth antenna 326.

FIG. 11 describes that operation 1101 through operation 1109 are performed by the wireless communication circuit 301, but this is merely the example. For example, operation 1101 through operation 1109 may be performed by the processor 120.

An electronic device 101 according to certain embodiments of the present disclosure may a first antenna group 310 which includes two or more antennas and receives a signal of a first frequency band, and a second antenna group 320 which includes one or more antennas and receives a signal of the first frequency band or a second frequency band and a wireless communication circuit 301 electrically connected to the first antenna group 310 and the second antenna group 320, and the wireless communication circuit 301 may receive a first signal on a first wireless communication channel of the first frequency band with an external device using the first antenna group, measure a first channel capacity of the first wireless communication channel using the first antenna group, select at least one antenna from the second antenna group 320 based on correlation between receiving a second signal of the first frequency band at the second antenna group 320 and receiving the first signal at the first antenna group 310, estimate a second channel capacity of a second wireless communication channel of the first frequency band which is able to be established using some of the first antenna group 310 and the selected at least one antenna of the second antenna group 320, and receive signals of the first frequency band by using some of the first antenna group and the selected at least one antenna, when the second channel capacity is greater than the first channel capacity.

According to an embodiment, the wireless communication circuit 301 may identify whether an SNR of the first signal has a value equal to or greater than a designated value, and the first channel capacity may be measured if the SNR value of the first signal has the value equal to or greater than the designated value.

According to an embodiment, the electronic device 101 may further include a memory 130, and the memory 130 may store correlation information.

According to an embodiment, the wireless communication circuit 3010 may obtain the correlation information from the memory 130, and select the at least one antenna from the second antenna group 320 based on the correlation information.

According to an embodiment, the electronic device 101 may further include a switch module 340 electrically connected to the first antenna group 310 and the second antenna group 320, and the wireless communication circuit 301 may receive the signal of the first frequency band using one of an antenna 311 of the first antenna group 310 and an antenna 325 of the second antenna group 320 by controlling the switch module 340.

According to an embodiment, the electronic device 101 may further include a plurality of lumped elements and a first matching circuit 801 electrically connected to the plurality of the lumped elements. The wireless communication circuit 301 may control the first matching circuit 801 to electrically connect the first antenna 311 of the first antenna group 310 with the plurality of the lumped elements.

According to an embodiment, the first matching circuit 801 may include a SPDT switch.

According to an embodiment, the electronic device 101 may further include a housing including a first side surface, a second side surface perpendicular to the first side surface and a third side surface parallel to the first side surface and perpendicular to the second side surface, the first antenna group 310 may be disposed adjacent to the first side surface, and the second antenna group 320 may be disposed adjacent to the third side surface.

According to an embodiment, the first antenna group 310 is configured to perform MIMO.

The first antenna group 310 may include the first antenna 311, a second antenna 312, a third antenna 313 and a fourth antenna 314, the second antenna group 320 may include the fifth antenna 325 and a sixth antenna 326, and if the second channel capacity is greater than the first channel capacity, the wireless communication circuit 301 may control to receive the signal of the first frequency band using the first antenna 311, the second antenna 312, the fifth antenna 325 and the sixth antenna 326.

An operation method of an electronic device 101 according to certain embodiments of the present disclosure may include controlling the first antenna group 310 to receive a first signal on a first wireless communication channel of a first frequency band with an external device, measuring a first channel capacity of the first wireless communication channel, selecting at least one antenna from the second antenna group 320 based on correlation between receiving a second signal of the first frequency band at the second antenna group 320 and receiving the first signal at the first antenna group 310, estimating a second channel capacity of a second wireless communication channel of the first frequency band which is able to be established using some of the first antenna group 310 and the selected at least one antenna of the second antenna group 320, and receiving signals of the first frequency band by using some of the first antenna group 310 and the selected at least one antenna, when the second channel capacity is greater than the first channel capacity.

According to an embodiment, the operating method of the electronic device 101 may further include identifying whether an SNR of the first signal has a value equal to or greater than a designated value, and the first channel capacity may be measured if the SNR value of the first signal has the value equal to or greater than the designated value.

According to an embodiment, the operating method of the electronic device 101 may further include obtaining correlation information from a memory 130, and selecting the at least one antenna from the second antenna group based on the correlation information.

According to an embodiment, the operating method of the electronic device 101 may further include receiving the signal of the first frequency band using one of the first antenna 311 of the first antenna group 310 and the fifth antenna 325 of the second antenna group 320 by controlling a switch module 340.

According to an embodiment, the operating method of the electronic device 101 may further include controlling a first matching circuit 801 to electrically connect the first antenna 311 of the first antenna group 310 with a plurality of lumped elements.

According to an embodiment, the switch module comprises a single pole double through (SPDT) switch.

According to an embodiment, the first channel capacity is a first peak data rate and the second channel capacity is a second peak data rate.

According to an embodiment, the correlation between receiving the second signal of the first frequency band at the second antenna group and receiving the first signal at the first antenna group is based at least in part on a degree of radiation pattern overlap between radiation patterns of the first antenna group and the second antenna group.

According to an embodiment, selecting the at least one antenna from the second antenna group comprises selecting the at least one antenna from the second antenna group having a lowest radiation pattern overlap with antennas of the first antenna group.

According to an embodiment, receiving the signals of the first frequency band using some of the first antenna group and the selected at least one antenna comprises performing multiple input multiple output (MIMO).

An electronic device 10 according to certain embodiments of the present disclosure may include a plurality of antennas 300 and a wireless communication circuit 301 electrically connected to the plurality of the antennas 300, and the wireless communication circuit 301 may establish a first wireless communication channel based a first frequency band with an external device using a first antenna group 310 including a first antenna 311 of the plurality of the antennas 300, receive a first signal over the first communication channel, measure a channel capacity of the first wireless communication channel as a first channel capacity, select a fifth antenna 325 based on correlation between receiving a second signal of the first frequency band using a second antenna group 320 including the fifth antenna 325 of the plurality of the antennas 300 and receiving the first signal using the first antenna group 310, estimate a channel capacity of a second wireless communication channel established based on the first frequency band with the external device, using a third antenna group including the first antenna 311 of the first antenna group 310 and the fifth antenna 325 of the second antenna group 320, and receive a signal of the first frequency band from the external device using the third antenna group, if the second channel capacity is greater than the first channel capacity.

The electronic device 101 may further include a memory 130, and the memory 130 may store information of the correlation.

The wireless communication circuit 301 may obtain the correlation information from the memory 130, and select the second antenna from the second antenna group based on the obtained correlation information.

The electronic device 101 may further include a switch module 340 electrically connected to the plurality of the antennas 300, and the wireless communication circuit 301 may receive the first signal of the first frequency band using one of the first antenna 311 of the first antenna group 310 and the fifth antenna 325 of the second antenna group 320 by controlling the switch module 340.

The electronic device 101 may further include a plurality of lumped elements and a first matching circuit 801 electrically connected to the plurality of the lumped elements, and the wireless communication circuit 301 may control the first matching circuit 801 to electrically connect the first antenna 311 of the first antenna group 310 to the plurality of the lumped elements.

Although certain embodiments are described with a degree of particularity, it shall be understood that the foregoing embodiments are not intended to be limiting. Moreover, numerous modifications, substitutions, may be made, and certain parts may be omitted, without departing from the spirit and the scope of the disclosure.

What is claimed is:

1. An electronic device comprising:
a first antenna group comprising two or more antennas, and receiving a signal of a first frequency band, and
a second antenna group including one or more antennas, and receiving a signal of the first frequency band or a second frequency band; and
a wireless communication circuit electrically connected to the first antenna group and the second antenna group, wherein the wireless communication circuit is configured to:
receive a first signal on a first wireless communication channel of the first frequency band with an external device using the first antenna group,
measure a first channel capacity of the first wireless communication channel using the first antenna group,
select at least one antenna from the second antenna group based on correlation between receiving a second signal of the first frequency band at the second antenna group and receiving the first signal at the first antenna group,
estimate a second channel capacity of a second wireless communication channel of the first frequency band which is able to be established using some of the first antenna group and the selected at least one antenna of the second antenna group, and
receive signals of the first frequency band by using some of the first antenna group and the selected at least one antenna, in case that the second channel capacity is greater than the first channel capacity.

2. The electronic device of claim 1, wherein the wireless communication circuit is further configured to identify whether a signal to noise ratio (SNR) of the first signal has a value equal to or greater than a designated value, and
wherein the first channel capacity is measured in case that the SNR value of the first signal has the value equal to or greater than the designated value.

3. The electronic device of claim 1, further comprising:
a memory,
wherein the memory stores correlation information.

4. The electronic device of claim 3, wherein the wireless communication circuit is configured to:
obtain the correlation information from the memory, and
select the at least one antenna from the second antenna group based on the correlation information.

5. The electronic device of claim 1, further comprising:
a switch module electrically connected to the first antenna group and the second antenna group,
wherein the wireless communication circuit receives the signal of the first frequency band using one of an antenna of the first antenna group and an antenna of the second antenna group by controlling the switch module.

6. The electronic device of claim 5, wherein the switch module comprises a single pole double through (SPDT) switch.

7. The electronic device of claim 1, further comprising:
a plurality of lumped elements; and
a matching circuit electrically connected to the plurality of the lumped elements,
wherein the wireless communication circuit controls the matching circuit to electrically connect the first antenna group with the plurality of the lumped elements.

8. The electronic device of claim 1, further comprising:
a housing comprising a first side surface, a second side surface perpendicular to the first side surface and a third side surface parallel to the first side surface and perpendicular to the second side surface,
wherein the first antenna group is disposed adjacent to the first side surface, and
wherein the second antenna group is disposed adjacent to the third side surface.

9. The electronic device of claim 1, wherein the first antenna group are configured to perform multiple input multiple output (MIMO).

10. The electronic device of claim 1, wherein the first antenna group comprises a first antenna, a second antenna, a third antenna and a fourth antenna,
wherein the second antenna group includes a fifth antenna and a sixth antenna, and
wherein, in case that the second channel capacity is greater than the first channel capacity, the wireless communication circuit controls to receive the signal of the first frequency band using the first antenna, the second antenna, the fifth antenna and the sixth antenna.

11. A method of operating an electronic device, the electronic device comprising a first antenna group and a second antenna group, the method comprising:
controlling the first antenna group to receive a first signal on a first wireless communication channel of a first frequency band with an external device;
measuring a first channel capacity of the wireless communication channel using the first antenna group;
selecting at least one antenna from the second antenna group based on correlation between receiving a second signal of the first frequency band at the second antenna group and receiving the first signal at the first antenna group;
estimating a second channel capacity of a second wireless communication channel of the first frequency band which is able to be established using some of the first antenna group and the selected at least one antenna of the second antenna group; and
receiving signals of the first frequency band by using some of the first antenna group and the selected at least one antenna, in case that the second channel capacity is greater than the first channel capacity.

12. The method of claim 11, further comprising:
identifying whether a signal to noise ratio (SNR) of the first signal has a value equal to or greater than a designated value,
wherein the first channel capacity is measured in case that the SNR value of the first signal has the value equal to or greater than the designated value.

13. The method of claim 11, further comprising:
obtaining correlation information from a memory; and
selecting the at least one antenna from the second antenna group based on the correlation information.

14. The method of claim 11, further comprising:
receiving the signal of the first frequency band using one of the first antenna of the first antenna group and the second antenna of the second antenna group further comprises controlling a switch module.

15. The method of claim 11, further comprising:
controlling a matching circuit to electrically connect the first antenna group with a plurality of lumped elements.

16. The method of claim 14, wherein the switch module comprises a single pole double through (SPDT) switch.

17. The method of claim 11, wherein the first channel capacity is a first peak data rate and the second channel capacity is a second peak data rate.

18. The method of claim 11, wherein the correlation between receiving the second signal of the first frequency band at the second antenna group and receiving the first signal at the first antenna group is based at least in part on a degree of radiation pattern overlap between radiation patterns of the first antenna group and the second antenna group.

19. The method of claim 18, wherein selecting the at least one antenna from the second antenna group comprises selecting the at least one antenna from the second antenna group having a lowest radiation pattern overlap with antennas of the first antenna group.

20. The method of claim 11, wherein receiving the signals of the first frequency band using some of the first antenna group and the selected at least one antenna comprises performing multiple input multiple output (MIMO).

* * * * *